(12) United States Patent
Cheung et al.

(10) Patent No.: US 7,070,657 B1
(45) Date of Patent: Jul. 4, 2006

(54) METHOD AND APPARATUS FOR DEPOSITING ANTIREFLECTIVE COATING

(75) Inventors: David Cheung, Foster City, CA (US); Joe Feng, Santa Clara, CA (US); Judy H. Huang, Los Gatos, CA (US); Wai-Fan Yau, Mountain View, CA (US)

(73) Assignee: Applied Materials Inc., Santa Clara, CA (US)

( * ) Notice: Subject to any disclaimer, the term of this patent is extended or adjusted under 35 U.S.C. 154(b) by 548 days.

(21) Appl. No.: 09/418,818

(22) Filed: Oct. 15, 1999

Related U.S. Application Data

(60) Division of application No. 08/672,888, filed on Jun. 28, 1996, now Pat. No. 5,968,324, which is a continuation-in-part of application No. 08/567,338, filed on Dec. 5, 1995, now abandoned.

(51) Int. Cl.
*C23C 16/52* (2006.01)
*C23F 1/00* (2006.01)
*H01L 21/306* (2006.01)

(52) U.S. Cl. ............... 118/715; 118/665; 118/688; 156/345.29; 156/345.24

(58) Field of Classification Search ............... 427/574, 427/571, 10; 204/192.28; 372/50; 430/311, 430/5; 428/446
See application file for complete search history.

(56) References Cited

U.S. PATENT DOCUMENTS

| | | | |
|---|---|---|---|
| 3,990,100 A | 11/1976 | Mamine et al. ............... 357/30 |
| 4,877,641 A * | 10/1989 | Dory .......................... 427/574 |
| 4,888,190 A | 12/1989 | Felts et al. .................... 427/10 |
| 4,888,199 A * | 12/1989 | Felts et al. .................... 427/10 |
| 4,910,122 A | 3/1990 | Arnold et al. ............... 430/313 |
| 4,992,299 A | 2/1991 | Hochberg et al. ............. 427/38 |
| 4,992,306 A | 2/1991 | Hochberg et al. ........ 427/255.3 |
| 5,068,124 A | 11/1991 | Batey et al. .................. 427/39 |
| 5,178,905 A | 1/1993 | Kanai et al. ................. 427/570 |
| 5,246,744 A | 9/1993 | Matsuda et al. ............. 427/574 |
| 5,286,581 A * | 2/1994 | Lee .............................. 430/5 |
| 5,288,527 A | 2/1994 | Jousse et al. ............... 427/579 |
| 5,300,460 A * | 4/1994 | Collins et al. .............. 438/712 |
| 5,330,883 A | 7/1994 | Garza ......................... 430/513 |
| 5,340,621 A | 8/1994 | Matsumoto et al. ........ 427/571 |
| 5,364,665 A * | 11/1994 | Felts et al. .................. 427/571 |

(Continued)

FOREIGN PATENT DOCUMENTS

EP 0 291 181 A2 11/1988

(Continued)

OTHER PUBLICATIONS

C. Lee, "Global model of Ar, O2, Cl2, and Ar/O2 high-density plasma discharges", J.Vac.Sci.Technol.A 13(2), Mar./Apr. 1995, pp. 368-380.*

(Continued)

*Primary Examiner*—Rudy Zervigon
(74) *Attorney, Agent, or Firm*—Townsend & Townsend & Crew

(57) ABSTRACT

This invention provides a stable process for depositing an antireflective layer. Helium gas is used to lower the deposition rate of plasma-enhanced silane oxide, silane oxynitride, and silane nitride processes. Helium is also used to stabilize the process, so that different films can be deposited. The invention also provides conditions under which process parameters can be controlled to produce antireflective layers with varying optimum refractive index, absorptive index, and thickness for obtaining the desired optical behavior.

27 Claims, 3 Drawing Sheets

U.S. PATENT DOCUMENTS

| | | | | |
|---|---|---|---|---|
| 5,436,463 A | | 7/1995 | Rostoker | 250/559.04 |
| 5,665,214 A | | 9/1997 | Iturralde | 204/298.03 |
| 5,968,324 A | * | 10/1999 | Cheung et al. | 204/192.28 |

FOREIGN PATENT DOCUMENTS

| | | |
|---|---|---|
| EP | 0 588 087 A2 | 3/1994 |
| JP | 01-187239 | 7/1989 |
| JP | 06-240459 | 8/1994 |

OTHER PUBLICATIONS

J.S. Maa et al, "Reflectivity reduction by oxygen plasma treatment of capped metalization layer", J.Vac.Sci. Technol.B 7(2), Mar./Apr. 1989, pp. 145-149.*

M.K. Puchert et al, "Gas-plasma interactions in a filtered cathodic arc" J.Vac.Sci.Technol.A 10(6), Nov./Dec. 1992, pp. 3493-3497.*

J. Bately and E. Tierney, "Low-temperature deposition of high-quality silicon dioxide by plasma-enhanced chamical vapor deposition" J.Appl.Phys. 60(9), Nov. 1, 1986, pp. 3136-3145.*

Database CAPLUS, Chemical Abstracts, vol. 120 (Columbus, OH), Abstract No. 121821 issued 1994, Kushner, Mark J., "Plasma Chemistry of Helium/Oxygen/Silane and Helium/Nitrous Oxide/Silane Mixtures for Remote Plasma-Activated Chemical Vapor Deposition of Silicon Dioxide", Journal of Applied Physics (1993, 74(11) 6538-53) 1994.

Ogawa, T. et al., "SiOxNy:H: High Performance Anti-Reflective Layer for the Current and Future Optical Lithography", SPIE (1994), 2197:722-732.

Database CAPLUS, Chemical Abstracts, vol. 119 (Columbus, OH), Abstract No. 60911 issued 1993, Smith et al., "Chemistry of Silicon Dioxide Plasma Deposition", Journal of the Electrochemical Society, 140(5), 1496-503, 1993.

Hishikawa et al., Principles for Controlling the Optical and Electrical Properties of Hydrogenated Amorphous Silicon Deposited from a Silane Plasma;, Journal of Applied Physics, 73 990, 4227-42.31, May 1993.

Database CAPLUS, Chemical Abstracts, vol. 111 (Columbus, OH) Abstract No. 145111 issued 1989, Rahman, Saadah Abdul, "The Effect of Helium Dilution n PECVD Silicon Dioxide", Jurnal Fizik Malaysia, 10(1), 20-3, 1989.

Knolle, Correlation of Refractive Index and Silicon Content of Silicon Oxynitride Films;, *Thin Solid Films*, 168:123-132, Jan. 1989.

Tsu, et al., "Deposition of Silicon Oxynitride Thin Films by Remote Plasma Enhanced Chemical Vapor Deposition", *Journal of Vacuum Science & Technology, Part A*,5(4); 1998-2000, Jul./Aug. 1987.

Database CAPLUS, Chemical Abstracts, vol. 105 (Columbus, OH) Abstract No. 49711 issued 1986, Pai et al., "Infrared Spectroscopic Study of Silicon Oxide (SiOx). Films Produced by Plasma Enhanced Chemical Vapor Deposition", *Journal of Vacuum Science and Technology*, 4(3, Pt. 1), 689-94, 1986.

Tsu et al., "Local Atomic Structure in thin Films of Silicon Nitride and Silicon Diimide Produced by Remote Plasma-Enhanced Chemical-Vapor Deposition", *Physical Review B :Condensed Matter*, vol. 33, No. 10, American Physical Society, pp. 7069-7076, May 1986.

* cited by examiner

| INCREASE IN: | EFFECT OF INCREASE ON | | | |
|---|---|---|---|---|
| | n | k | t | r |
| TEMPERATURE | ↑ | ↑ | ↑ | ↑ |
| PRESSURE | ↓ | ↓ | ↓ | ↓ |
| POWER | ↓ | ↓ | ↑ | ↓ |
| SPACING | ↓ | ↓ | ↓ | ↓ |
| $SiH_4$ | ↑ | ↑ | ↑ | ↑ |
| $N_2O$ | ↓ | ↓ | ↑ | ↓ |
| $NH_3$ | ↑ | ↓ | ↑ | ↓ |
| $N_2$ | ↓ | ↓ | ↑ | ↓ |
| He | ↑ | ↑ | ↓ | ↑ |
| TOTAL GAS FLOW | ↑ | ↑ | ↑ | ↑ |

*FIG. 4*

METHOD AND APPARATUS FOR DEPOSITING ANTIREFLECTIVE COATING

CROSS REFERENCE TO RELATED APPLICATION

This application is a divisional of U.S. application Ser. No. 08/672,888, filed Jun. 28, 1996 now U.S. Pat. No. 5,968,324, which is a continuation-in-part patent application of U.S. application Ser. No. 08/567,338, filed Dec. 5, 1995 now abandoned, entitled "Anti-Reflective Coating and Method for Depositing Same."

BACKGROUND OF THE INVENTION

The present invention relates to apparatus for, and the processing of, semiconductor wafers. In particular, the invention relates to the deposition of antireflective layers during wafer processing.

In the manufacture of integrated circuits, photolithographic techniques are used to define patterns for layers in an integrated circuit. Typically, such photolithographic techniques employ photoresist or other light-sensitive material. In conventional processing, the photoresist is first deposited on a wafer, and then a mask having transparent and opaque regions which embody the desired pattern, is positioned over the photoresist. When the mask is exposed to light, the transparent portions allow light to expose the photoresist in those regions, but not in the regions where the mask is opaque. The light causes a chemical reaction to occur in the exposed portions of photoresist. A suitable chemical, or a chemical vapor or ion bombardment process, then is used to selectively attack either the reacted or unreacted portions of the photoresist. With the photoresist pattern remaining on the wafer itself now acting as a mask for further processing, the integrated circuit can be subjected to additional process steps. For example, material may be deposited on the circuit, the circuit may be etched, or other known processes carried out.

In the processing of integrated circuit devices with small feature sizes, for example, feature sizes having critical dimensions less than one-half micron, sophisticated techniques involving equipment known as steppers, are used to mask and expose the photoresist. The steppers for such small geometry products generally use monochromatic (single-wavelength) light, which enables them to produce very fine patterns. As repeated process steps are carried out, however, the topology of the upper surface of the substrate becomes progressively less planar. This uneven topology can cause reflection and refraction of the monochromatic light, resulting in exposure of some of the photoresist beneath the opaque portions of the mask. As a result, this differing local substrate surface typography can alter the fine patterns of photoresist, thereby changing the desired dimensions of the resulting regions of the semiconductor substrate.

In the manufacture of semiconductor devices, it is desirable that fluctuations in line width, or other critical dimensions, be minimized. Errors in such dimensions can result in open or short circuits, thereby ruining the resulting semiconductor devices. As a result, some semiconductor manufacturers now require that the dimensional accuracy of a photoresist pattern be within 5 percent. To achieve that dimensional accuracy, two approaches have been taken. Both approaches entail the use of another layer in addition to the photoresist layer.

The first approach uses a relatively thick organic film beneath the photoresist that absorbs incident light so that minimal reflection or refraction occurs. A disadvantage of such organic films is that they require more process steps, and being polymer-based, are difficult to etch.

A second approach is the use of an antireflective film for canceling reflections occurring at the photoresist-antireflective layer interface, and at the antireflective layer-substrate interface. In the prior art, silicon oxynitride (SiON) deposited using $NH_3$ gas has been used as an antireflective film. Upon exposure to light, however, an amino group from the SiON film reacts with the light sensitive component in the photoresist, thereby desensitizing the photoresist. This results in inaccurate photoresist patterns.

An article entitled "SiOxNy:H, high performance antireflective layer for the current and future optical lithography," *SPIE*, Vol. 2197 (1994), pp. 722–732, by Tohro Ogawa, et al., addresses the thin film interference concerns. The article teaches the use of an antireflective layer (ARL) in conjunction with the I-line, KrF, and ArF excimer laser lithographies. The exposure wavelengths used in these laser lithographies are 365 nm, 248 nm, and 193 nm, respectively. The article describes that as exposure wavelengths become shorter, stronger reflections from the interface between the photoresist and the substrate result. Hence, an ARL is needed to reduce the standing waves and thin film interference effects.

This ARL is described as canceling reflection from both the interface between the photoresist and the ARL, and from the interface between the ARL and the substrate. The article describes a complicated equi-energy contour-based procedure for determining the parameters to achieve the desired cancellation. According to the procedure described in this article by Sony, the parameters are obtained by finding common regions of the equi-energy contour lines for a plurality of photoresist film thicknesses. The article describes refractive index, absorptive index, and thickness values for its ARL, and though the article does not specify it, Applied Materials inventors have determined that these values correspond to a phase shift of 180° between the reflections. The Applied engineers, however, were unable to achieve the results described in the article, and it is believed that the process is unstable.

Sony has also filed a European patent application (Application No. 93113219.5, Publication No. EP 0 588 087 A2) for a process for depositing an ARL with selected parameters. The Sony application discusses the $SiH_4$ and $N_2O$ ratio, and how the ratio affects the optical and chemical properties of the ARL deposited. The Sony application also teaches the use of argon.

SUMMARY OF THE INVENTION

The present invention provides apparatus and a process for depositing an antireflective layer. Because ARL films are thin, to have a stable process it is desirable to have a low deposition rate for the process. The invention provides apparatus and a process to lower the deposition rate of plasma-enhanced silane oxide, silane oxynitride, and silane nitride processes. In a preferred embodiment helium is used. Although helium is a known carrier gas in chemical vapor deposition, its use in the present invention is for controlling the deposition rate of the processes. By adding helium, more precise control of the thin film thickness is provided, particularly over longer periods of equipment operation. The helium also helps stabilize the process, enabling different films to be deposited, and the film deposited to be well-controlled.

The present invention also provides equipment and process conditions under which parameters can be controlled to produce ARLs with various optimum refractive index, absorptive index, and thickness values for obtaining the desired cancellations for the different exposure wavelengths and substrates. In one embodiment, the apparatus and process described by the present invention use $N_2$ and $NH_3$, in addition to a desired ratio of $SiH_4$ to $N_2O$, to further control the optical and chemical properties of the ARL deposited. The effects of $N_2$ and $NH_3$ are particularly dominant in process regimes where $SiH_4$ and $N_2O$ have minimal or no effect on the ARL properties, e.g., at low temperature. The invention teaches the addition of $NH_3$ and $N_2$ in the process to change the composition of the film, allowing more freedom and finer tuning of the refractive index and the absorptive index. Furthermore, the process is compatible with the use of helium, which is more cost-effective than argon. Helium also allows for improved stress control of the ARL layer deposited. This helps prevent the film from becoming too tensile, which can cause it to flake off the substrate after deposition.

As applied to the process above, the addition of helium also achieves plasma stability, which in turn ensures the deposition of a uniform film. Furthermore, the helium provides sufficient control of the ARL deposition process, so that ARLs with optimum values of refractive index, absorptive index, and thickness can be developed within practical process parameters for exposure wavelengths in the range of 190–900 nm. This is highly desirable because cancellation of the reflected light for different exposure wavelengths depends on several factors: the incident light wavelength, the phase shift (which is determined by the thickness of the ARL), and the intensity of the reflection (determined by the chemical composition of the ARL). Hence, control of the optical and chemical properties of the ARL is necessary to achieve the desired cancellations.

The present invention determines the optimum refractive index, absorptive index, and thickness values for phase shifts greater than 180° (e.g., 540°, 900°, etc.) using destructive interference equations. (A sample calculation of how the refractive index n, absorptive index k, and thickness t values are determined by the current invention is shown below.) For an ARL to produce phase shifts of 540° or larger between the reflections, the thickness will be higher, which means higher absorptive index values, because the ARL must absorb more refracted light. In one embodiment, the invention provides an ARL with optimum refractive index n, optimum absorptive index k, and optimum thickness t values to produce a phase shift of 540° between the reflections.

BRIEF DESCRIPTION OF THE DRAWINGS

FIG. 4 is a trend chart for the process of depositing the antireflective layer of the present invention.

DESCRIPTION OF THE SPECIFIC EMBODIMENTS

Figure 1:
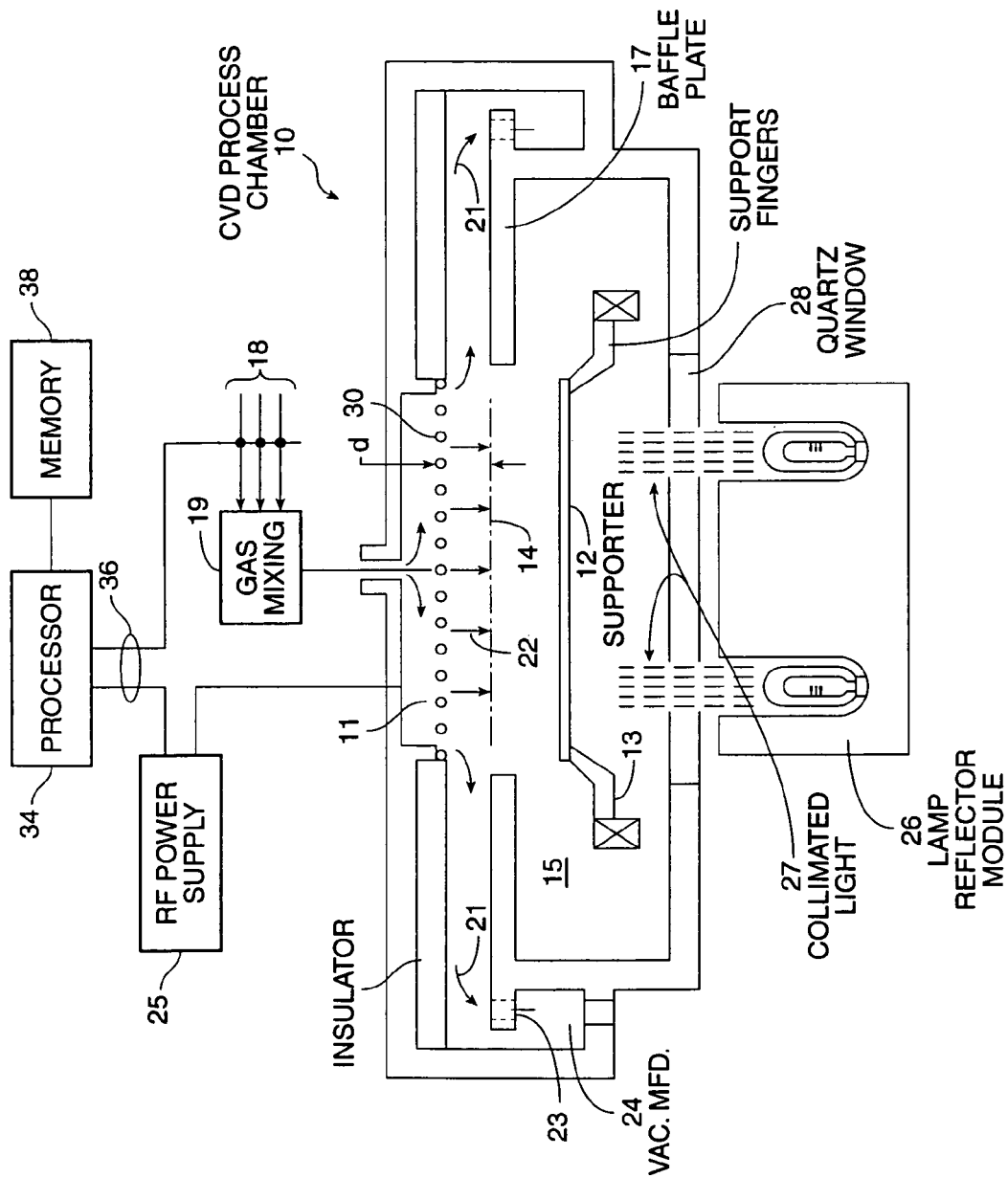
FIG. 1 is a vertical, cross-sectional view of one embodiment of a simplified chemical vapor deposition (CVD) apparatus used for processing the antireflective coating according to the present invention.

A preferred embodiment of the process for depositing an ARL according to the present invention comprises apparatus for and the use of plasma-enhanced chemical vapor deposition (PECVD) technique to bring about a chemical reaction between $SiH_4$ and $N_2O$, in the presence of He, with the $SiH_4$ to $N_2O$ ratio being between about 0.5 to 3.0 and preferably 1.0. The process further includes the addition of $NH_3$, $N_2$, and He gases. FIG. 1 illustrates one embodiment of a simplified, parallel plate PECVD system 10 having a vacuum chamber 15 in which the antireflective layer can be deposited according to the present invention.

System 10 contains a gas distribution manifold 11 for dispersing the deposition gases to a substrate, not shown, but which is placed flat on the supporter 12. The supporter 12 is highly heat-responsive and is mounted on supports 13 so that supporter 12 (and the substrate supported on the upper surface of supporter 12) can be controllably moved between a lower loading/offloading position, and an upper processing position 14 represented by a dashed line, which is closely adjacent to manifold 11.

Depending on the desired refractive index, absorptive index, and thickness to be achieved, the spacing between supporter 12 and manifold 11 is in the range of 200–600 mils, the substrate temperature is in the range of 200–400° C., and the chamber pressure is maintained at 1–6 torr. ARLs with varying refractive index, absorptive index, and thickness can be deposited within these process parameters for any exposure wavelengths between 190–900 nm; and the different optimum refractive index, absorptive index, and thickness for the different wavelengths can be consistently achieved by varying the parameters and the rate at which the $SiH_4$, $N_2O$, $NH_3$, $N_2$, and He gases are introduced into the chamber. Within these ranges, the preferred range for the spacing is 400–600 mils. For the substrate temperature, the preferred range is 300–400° C., and the preferred range for the chamber pressure is 4.5–5.5 torr.

When supporter 12 and the wafer are in processing position 14, they are surrounded by a baffle plate 17 having a plurality of spaced holes 23 which allow gas to exhaust into an annular vacuum manifold 24. Deposition gases are supplied through lines 18, having control valves (not shown), into a gas mixing chamber 19 where they are combined and supplied to manifold 11. Although He is a known carrier gas, its use in the present process is for controlling the parameters of the process. As will be described later, the amount of He used affects the optical and chemical properties of the ARL deposited. Furthermore, He helps achieve the desired chamber pressure without altering the chemical composition of the film, thereby ensuring process stability, which in turn ensures the deposition of a uniform film. Because the ARL is a thin film, thickness control is important, and a low deposition rate is necessary to achieve control over the desired thickness. The addition of He lowers the deposition rate, thus allowing for thickness control, in addition to the control of the film properties.

During processing of a wafer, gas inlet to manifold 11 is vented toward, and uniformly distributed radially across, the surface of the substrate as indicated by arrows 22 and 21 representing gas flow. $SiH_4$ and $N_2O$ are both introduced into chamber 19 at a rate of 5–300 sccm, with the $SiH_4$ to $N_2O$ ratio between about 0.5 and 3.0, but preferably about 1.0. $NH_3$, $N_2$, and He may be added as explained below, depending on the values of refractive index, absorptive index, and thickness desired, and the process regimes. If a wider range of refractive index, absorptive index, and thickness values is desired, $NH_3$, $N_2$, and additional He will be added to the process, and are introduced into the chamber at a rate of 0–300 sccm, 0–4000 sccm, and 5–5000 sccm, respectively. Within these ranges, the preferred range for introducing $SiH_4$ into the chamber is 15–160 sccm; for $N_2O$, the preferred range is 15–160 sccm; for $NH_3$, the preferred range is 0–300 sccm; for $N_2$, the preferred range is 0–500 sccm; and for He, the preferred range is 500–4000 sccm. After the reactions are complete, the remaining gases are exhausted via ports 23 into the circular vacuum manifold 24 and out through an exhaust line (not shown). The optimal values for the gases are $SiH_4$ 40–120 sccm, $N_2O$ 30–120 sccm, He 1500–2500 sccm, $N_2O$–300 sccm, and $NH_3$ 0–150 sccm. These are representative values for an eight-inch chamber as made by Applied Materials. Other sizes of chambers or chambers made by other manufacturers will have different values.

A controlled plasma of $SiH_4$ and $N_2O$ is formed adjacent to the substrate by RF energy applied to manifold 11 from RF power supply 25. Gas distribution manifold 11 is also an RF electrode, while supporter 12 is grounded. The RF power supply 25 supplies power ranging from 50–500 watts, to manifold 11 to slow down or enhance the decomposition of the $SiH_4$ and $N_2O$ introduced into chamber 15.

A circular external lamp module 26 provides a collimated annular pattern of light 27 through quartz window 28 onto supporter 12. Such heat distribution compensates for the natural heat loss pattern of the supporter and provides rapid and uniform supporter and substrate heating for effecting deposition. A motor, not shown, raises and lowers supporter 12 between a processing position 14 and a lower, substrate-loading position.

The motor, control valves connected to lines 18, and RF power supply 25 are controlled by a processor 34 over control lines 36, of which only some are shown. Using these control lines, the processor controls the entire process of depositing the ARL. Processor 34 operates under the control of a computer program stored in a memory 38. The computer program dictates the timing, mixture of gases, chamber pressure, chamber temperature, RF power levels, supporter position, and other parameters of the process. Typically, the memory contains computer readable information for causing the processor to introduce a first process gas comprising $SiH_4$ and $N_2O$ into the chamber, and a second process gas comprising He into the chamber.

The above description is mainly for illustrative purposes and should not be considered as limiting the scope of the present invention. Variations of the above described system such as variations in supporter design, heater design, location of RF power connections, etc., are possible. Additionally, other plasma CVD equipment such as electron cyclotron resonance (ECR) plasma CVD equipment, induction-coupled RF high density plasma CVD equipment, or the like may be employed. The ARL and method for forming such a layer of the present invention is not limited to any specific apparatus or to any specific plasma excitation method.

Similarly, the use of helium for controlling the deposition rate of the process and for stabilizing the process, is applicable to thin film depositions in general, and is not limited to ARL film depositions. Specifically, it could be used to lower the deposition rate of existing plasma-enhanced silane oxide, silane oxynitride, and silane nitride processes. Although helium is used in the preferred embodiment, other inert gases may also be used instead of helium.

Figure 2:
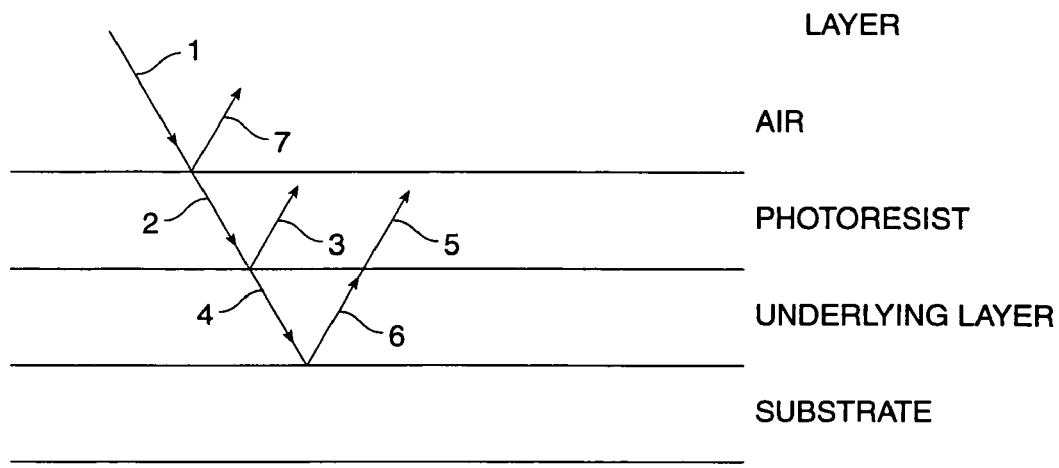
FIG. 2 is a vertical, cross-sectional view of paths of reflected and refracted light of an incident light beam which strikes the surface of a multilayer semiconductor device, for example, during a photolithographic process.

FIG. 2 is a vertical, cross-sectional view of typical paths of reflected and refracted light of an incident light beam that strikes the surface of a multi-layer semiconductor device during a photolithographic process. As shown in FIG. 2, for an incident light beam 1 that strikes the semiconductor structure, the photoresist pattern exposure could be distorted by a reflection 3 between the photoresist layer and an underlying layer, and another reflection 6 between the underlying layer and the substrate which results in light 5 entering the photoresist.

Figure 3:
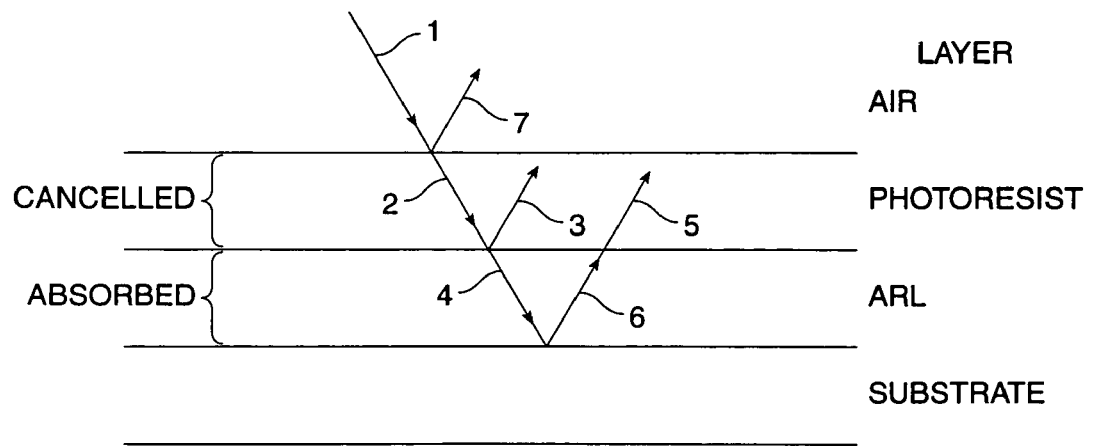
FIG. 3 shows the effect of using an antireflective layer according to the present invention.

In FIG. 3, the dashed light paths illustrate the function of an ARL according to the present invention. As shown, light rays 3 and 5 (which are almost equal in intensity and have a phase difference of 540° or larger) will substantially cancel each other, while light rays 4 and 6 will be absorbed by the ARL. Hence, the only light that exposes the photoresist is the incident light from ray 2. As previously mentioned, an ARL according to the present invention is compatible with the photoresist, thus eliminating the concern that the photoresist may be neutralized. Furthermore, as discussed below, ARLs with different optimum refractive index, absorptive index, and thickness values can be achieved for cancellation of reflections of different exposure wavelengths between 190–900 nm.

FIG. 4 is a chart showing the effects of the different process parameters on the process for depositing the anti-reflective layer of the present invention. As described, the properties of the ARL can be changed by changing the different parameters. As shown by the chart, increasing the substrate temperature will increase the refractive index n, absorptive index k, thickness t, and reflectance r values of the ARL deposited. Similarly, increasing the total gas flow into the chamber, or increasing the rate at which $SiH_4$ is introduced into the chamber, will also increase the refractive index n, absorptive index k, thickness t, and reflectance r values of the ARL deposited.

On the other hand, increasing the pressure of chamber 19, or the spacing between supporter 12 and manifold 11, has the effect of decreasing the refractive index n, absorptive index k, thickness t, and reflectance r values of the ARL deposited. Alternatively, increasing the power supplied to RF power supply 25 to generate more plasma has the effect of decreasing the refractive index n, absorptive index k, and reflectance r values while increasing the thickness of the ARL deposited. A similar effect can also be achieved by increasing the rate at which $N_2O$ or $N_2$ is being introduced into chamber 19. The opposite effect of increasing the refractive index n, absorptive index k, and reflectance r values, while decreasing the thickness of the ARL deposited, can be achieved by increasing the rate at which He is introduced into chamber 19. Finally, the amount of $NH_3$ introduced into chamber 19 can be increased to increase the refractive index n and thickness t values, while decreasing the absorptive index k and reflectance r values.

The following discussion of the ARL explains the calculations below. These calculations pertain to the deposition of SiON films by plasma-enhanced CVD techniques, an example of which is as described above. The values obtained from the calculations are for an exposure wavelength of approximately 248 nm. At this wavelength, an ARL deposited in this process can have refractive index n ranging from 1.7 to 2.4, and absorptive index k ranging from 0 to 1.3.

An effective ARL minimizes the variation of light available for PR absorption as the thickness of the PR varies. This requires the substantial cancellation of light reflected from the interface between the PR and the ARL, i.e., the substantial cancellation of light rays 3 and 5 as shown in FIG. 3. Substantial cancellation can be achieved if the following two requirements are met simultaneously for light ray 3 and light ray 5. The phase difference between ray 3 and ray 5 is close to an odd multiples of 180°.

$$n_3 \cdot 2t = \frac{1}{2}(m\lambda) \quad (1)$$

The intensity of ray 3 and the intensity of ray 5 are almost identical.

$$I_3 = I_5 \quad (2)$$

The first of the above requirements is described by the destructive interference equation, which is represented by Equation 1. The second equation describes the condition for matching the intensities of ray 3 and ray 5.

For a given substrate and photoresist, conditions 1 and 2, as represented by Equations 1 and 2, can be satisfied simultaneously with appropriate choices of refractive index n, absorptive index k, and thickness t of the ARL film. Solutions for m=3 (540° phase difference), m=5 (900° phase difference) and higher odd multiples of 180° phase difference require a larger ARL thickness to satisfy Equation 1 as compared to the m=1 case. Because of the larger ARL thickness, different refractive index, and absorptive index values are needed to satisfy Equation 2. These different refractive index, and absorptive index values can be achieved by the present invention for ARL thicknesses in the range of 500–3000 angstroms.

It is desirable to achieve refractive index and absorptive index values for thicker ARLS, because the increased thickness can be a major advantage in the manufacturing of an ARL for achieving film consistency from wafer to wafer. Because a thicker film requires a longer deposition time compared to a thinner film, the refractive index, absorptive index, and thickness of the film can be better controlled. For example, film thickness suggested by the SONY researchers is near 250 angstroms. Assuming a deposition rate of 2000 angstroms per minute, the deposition time would be 7.5 seconds, including the time for striking the plasma and extinguishing the plasma. These are not well-controlled regions of the deposition process, and generally contribute to wafer-to-wafer variation in thickness and film properties, including refractive index and absorptive index. If a film thickness of 750 angstroms can be used, the film deposition time is increased to 22.5 seconds and the fractional contribution of deposition time from striking and extinguishing the plasma is reduced threefold. This reduction in fractional contribution to deposition time from striking and extinguishing the plasma, substantially improves the wafer-to-wafer variation of refractive index, absorptive index, and thickness compared with the 250 angstroms film. This concept is not limited to m=3. It is valid for 5, 7, and all odd multiples of 180° phase difference of the solutions for Equation 1 and 2.

For applications requiring a hard mask, the ARL film left on the substrate can be used as hard mask during an etching step. This is possible if the thickness of the film is sufficient to allow for etching of the substrate without completely eroding the ARL layer. Hence, this is another potential advantage of using a thicker ARL film with refractive index and absorptive index values that correspond to higher odd multiple solutions to Equations 1 and 2.

Appendix A provides examples of refractive index n, absorptive index k and thickness t values, which correspond to solutions for 540° phase difference for Equations 1 and 2 at 248 nm with SiON. The refractive index n and the absorptive index k for the photoresist are assumed to be 1.80 and 0.011, respectively. The values of refractive index n and absorptive index k for Al, Al—Si, Al—Si—Cu, and Al—Cu are shown. Finally, the values of refractive index n and absorptive index k for W—Si are assumed to be 1.96 and 2.69, respectively. With two equations and three unknowns, one can choose the value of refractive index n, absorptive index k, or thickness t and then calculate the remaining two unknowns. Because the refractive index n value of SiON ARL films optimized with the above deposition process is about 2.2 to 2.3 at 248 nm, the refractive index n value is chosen to stay within this range throughout the calculation of Appendix A. Because absorptive index k values are tunable over a wide range with the above process, values of absorptive index k are not restricted.

The solutions provided in Appendix A are not exact optimized values for the ARL because of the simplicity of the model. For example, native oxides of Al, or W—Si, are simply neglected and their thicknesses are usually in the range of 10 to 20 angstroms. Also, the refractive index n and absorptive index k values of the ARL film are assumed to be constant throughout the thickness of the film. Thus, the solutions to Equations 1 and 2 only provide a guideline to the refractive index n, absorptive index k, and thickness of the desirable ARL film. Exact values of refractive index n, absorptive index k, and thickness for a specific application are determined experimentally by optimizing near the solution values from Equations 1 and 2.

For an Al substrate with deep UV (248 nm) photolithography, at m=3 an appropriate refractive index n value is about 2.3, an appropriate absorptive index k value is about 0.3 and an appropriate thickness value is about 800 angstroms. These solutions satisfy Equation 1 to within 8° of a 540° phase difference. For Equation 2, the difference in intensity between ray 3 and ray 5 is about 5 percent of incident intensity. For a W—Si substrate with deep UV photolithography, at m=3, an appropriate refractive index n is about 2.3, an absorptive index k is about 0.3 and a thickness about 800 angstroms. These solutions satisfy Equation 1 to within 8° of a 540° phase difference. For Equation 2, the difference in intensity between ray 3 and ray 5 is less than 5 percent of incident intensity.

For an Al substrate with deep UV photolithography, at m=5 an appropriate refractive index n value is about 2.3, an appropriate absorptive index k value is about 0.17 and an appropriate thickness value is about 1350 angstroms. These solutions satisfy Equation 1 to within 8° of a 900° phase difference. For Equation 2, the difference in intensity between ray 3 and ray 5 is about 5 percent of incident intensity. For a W—Si substrate with deep UV photolithography, at m=5, an appropriate refractive index n is about 2.3, an absorptive index k is about 0.18 and a thickness about 1350 angstroms. These solutions satisfy Equation 1 to within 8° of a 900° phase difference. For Equation 2, the difference in intensity between ray 3 and ray 5 is less than 5 percent of incident intensity.

For an Al substrate with deep UV photolithography, at m=7 an appropriate refractive index n value is about 2.3, an appropriate absorptive index k value is about 0.13 and an appropriate thickness value is about 1900 angstroms. These solutions satisfy Equation 1 to within 8° of a 1260° phase difference. For Equation 2, the difference in intensity between ray 3 and ray 5 is about 5 percent of incident intensity. For a W—Si substrate with deep UV photolithography, at m=7 an appropriate refractive index n is about 2.3, an absorptive index k is about 0.13 and a thickness about 1900 angstroms. These solutions satisfy Equation 1 to within 8° of a 1260° phase difference. For Equation 2, the difference in intensity between ray 3 and ray 5 is about 5 percent of incident intensity.

For an Al substrate with deep UV photolithography, at m=9 an appropriate refractive index n value is about 2.3, an appropriate absorptive index k value is about 0.10 and an appropriate thickness value is about 2430 angstroms. These solutions satisfy Equation 1 to within 8° of a 1620° phase difference. For Equation 2, the difference in intensity between ray 3 and ray 5 is about 5 percent of incident intensity. For a W—Si substrate with deep UV photolithography, at m=9 an appropriate refractive index n is about 2.3, an absorptive index k is about 0.10 and a thickness about 2430 angstroms. These solutions satisfy Equation 1 to within 8° of a 1620° phase difference. For Equation 2, the difference in intensity between ray 3 and ray 5 is about 5 percent of incident intensity.

For an Al substrate with deep UV photolithography, at m=11 an appropriate refractive index n value is about 2.3, an appropriate absorptive index k value is about 0.081 and an appropriate thickness value is about 2965 angstroms. These solutions satisfy Equation 1 to within 8° of 1980° phase difference. For Equation 2, the difference in intensity between ray 3 and ray 5 is about 5 percent of incident intensity. For a W—Si substrate with deep UV photolithography, at m=11 an appropriate refractive index n is about 2.3, a absorptive index k is about 0.081 and thickness about 2965 angstroms. These solutions satisfy Equation 1 to within 8° of a 2965° phase difference. For Equation 2, the difference in intensity between ray 3 and ray 5 is about 5 percent of incident intensity.

Solutions for higher odd multiples such as m=13, 15, or 17 can be found with increases in ARL thickness that satisfy Equation 1. With this increased thickness, a suitable absorptive index k value can be determined to satisfy Equation 2.

Appendix B includes a characterization chart showing some of the preferred ranges of the various process parameters used, and the effects of silane, ammonia, and temperature on the chemical and optical properties of the ARL deposited. The graphs following the chart show how reflectance versus wavelength, refractive index n versus wavelength, and absorptive index k versus wavelength vary with $SiH_4$ flow, supporter and manifold spacing, chamber pressure, RF power, $N_2O$ flow, $N_2$ flow, He flow, total gas flow, and temperature varies from a center value. The center values for $SiH_4$ flow, supporter and manifold spacing, chamber pressure, RF power, $N_2O$ flow, $N_2$ flow, He flow and temperature are respectively 51 sccm, 500 mils, 4.6 torr, 160 W, 30 sccm, 200 sccm, 2000 sccm, and 350° C. These values also correspond to the values of the respective process parameters that were kept constant as one of these process parameters is varied.

Appendix C includes graphs which show the effect of chamber pressure, RF power, supporter and manifold spacing, $SiH_4$ flow, $N_2O$ flow, He flow, and $N_2$ flow on the deposition rate of the process for depositing an ARL, and on the refractive index n, absorptive index k, and uniformity of the ARL deposited. In these graphs, if not stated otherwise, silane flow, supporter and manifold spacing, chamber pressure, RF power, $N_2O$ flow, $N_2$ flow, and helium flow are all kept constant at 51 sccm, 500 mils, 4.6 torr, 160 W, 30 sccm, 200 sccm, and 2000 sccm, respectively.

As will be understood by those of skill in the art, the present invention could be embodied in other specific forms without departing from the spirit or essential characteristics thereof. Accordingly, the foregoing description is intended to be illustrative of the preferred embodiments, and reference should be made to the appended claims for setting forth the scope of the invention.

APPENDIX A

Let:

- $n_1$ = real index of refraction of air
- $n_2$ = real index of refraction of photoresist
- $n_3$ = real index of refraction of ARL
- $n_4$ = real index of refraction of substrate
- $k_1$ = imaginary index of refraction of air
- $k_2$ = imaginary index of refraction of photoresist
- $k_3$ = imaginary index of refraction of ARL
- $k_4$ = imaginary index of refraction of substrate
- $t$ = ARL thickness
- $m$ = odd integer
- $\lambda$ = wavelength of incident radiation
- $I_3$ = intensity of beam #3
- $I_5$ = intensity of beam #5
- $I_1$ = intensity of beam #1
- $T_{12}$ = transmittance from air to photoresist
- $R_{23}$ = reflectance from ARL in photoresist
- $a_2$ = absorption factor in photoresist
- $T_{23}$ = transmittance from photoresist to ARL
- $a_3$ = absorption factor in ARL
- $R_{34}$ = reflectance from substrate in ARL
- $\Delta\varnothing$ = change in phase angle Using equations (1) and (2):

$$n_3 \cdot 2t = \tfrac{1}{2}(m\lambda) \qquad m = 3 \ (540°) \tag{1}$$

for $|n_2| < |n_3| < |n_4|$

1

APPENDIX A $$I_3 = I_5 \quad (2)$$

$$I_3 = I_1 \cdot T_{12} \cdot R_{23} \cdot a_2$$

$$I_5 = I_1 \cdot T_{12} \cdot a_2 \cdot T_{23} \cdot a_3 \cdot R_{34} \cdot a_3 \cdot T_{23}$$

Therefore, because $I_3 = I_5$ $$R_{23} = T_{23} \cdot a_3 \cdot R_{34} \cdot a_3 \cdot T_{23}$$

$$R_{23} = (T_{23})^2 \cdot (a_3)^2 \cdot R_{34}$$

These operations can be satisfied for $n_2$, $n_3$, $n_4$, $t$, $\lambda$, $k_2$, $k_3$, and $k_4$ where $$R_{23} = \frac{(n_2 - n_3)^2 + (k_2 - k_3)^2}{(n_2 + n_3)^2 + (k_2 + k_3)^2}$$

$$T_{23} = 1 - R_{23}$$

$$R_{34} = \frac{(n_3 - n_4)^2 + (k_3 - k_4)^2}{(n_3 + n_4)^2 + (k_3 + k_4)^2}$$

$$(a_3)^2 = \exp - \frac{2(2nk_3 \cdot 2t)}{\lambda}$$

For 248 nm with Al substrate, $n_2 = 1.8$, $k_2 = 0.011$

ARL $n_3 = 2.3$, $k_3 = 0.33$, $\tau = 700 - 850$ Å

Aℓ - Si $n_4 = 0.089$, $k_4 = 2.354$ $R_{23} = 0.0197$ $(T_{23})^2 = 0.961$ $R_{34} = 0.714$ $(a_3)^2 = 0.0814$ $R_{23} = 0.0197$ $(T_{23})^2 \cdot (a_3)^2 R_{34} = 0.0559$

APPENDIX B

ARL Film RBS/HFS Sample Results

| Process | DEEP-UV [w/NH₃] | DEEP-UV [w/o NH₃] | DEEP-UV [+60% SiH₄] | DEEP-UV [Standard] | DEEP-UV [-60% SiH₄] | I-LINE [300C dep] | I-LINE [400C dep] | I-LINE [w/o N₂] |
|---|---|---|---|---|---|---|---|---|
| Faceplate | Δ Nitride | Δ Nitride | Δ Nitride | Δ Nitride | Δ Nitride | GG Nitride | GG Nitride | GG Nitride |
| Pumping Plate | Δ Nitride | Δ Nitride | Δ Nitride | Δ Nitride | Δ Nitride | 5-hole | 5-hole | 13-hole |
| Blocker | Std. w/cntr holes | Std. w/cntr holes | Standard | Standard | Standard | Standard | Standard | Standard |
| Temperature(°C) | 350 | 350 | 350 | 350 | 350 | 300 | 400 | 350 |
| Pressure(torr) | 4.6 | 4.6 | 4.6 | 4.6 | 4.6 | 5.3 | 5.3 | 5.0 |
| Spacing(mils) | 500 | 500 | 500 | 500 | 500 | 525 | 525 | 460 |
| RF1 (watts) | 160 | 160 | 160 | 160 | 160 | 130 | 130 | 150 |
| SiH₄ (sccm) | 51 | 51 | 81 | 51 | 20 | 63 | 63 | 82 |
| N₂O (sccm) | 30 | 155 | 30 | 30 | 30 | 34 | 34 | 90 |
| N₂ (sccm) | 200 | 200 | 200 | 200 | 200 | 200 | 200 | 0 |
| He (sccm) | 2200 | 2200 | 2000 | 2000 | 2000 | 1900 | 1900 | 2200 |
| NH₃ (sccm) | 125 | | | | | | | |
| Thickness | 700A | 1200A | 300A | 300A | 300A | 300A | 300A | 300 |
| n | 2.3 | 1.8 | | 2.1 | | 2.5 | 2.65 | 2.5 |
| k | 0.3 | 0.14 | | 0.7 | | 0.42 | 0.63 | 0.39 |
| % reflectance | 1.10% | 1.80% | | 15% | | 4.000% | 9.00% | 2.5% |
| Atomic conc.(%) | | | | | | | | |
| H | 15.0% | 13.5% | 17.0% | 16.0% | 14.0% | 20.0% | 13.0% | 8.0% |
| C | 0.0% | 0.0% | 10.0% | 5.0% | 0.0% | 8.0% | 10.0% | 0.00% |
| N | 34.0% | 15.0% | 15.3% | 18.1% | 15.0% | 17.0% | 17.0% | 10.0% |
| O | 9.0% | 34.5% | 15.7% | 15.9% | 31.0% | 15.0% | 15.0% | 20.0% |
| Si | 42.0% | 37.0% | 42.0% | 45.0% | 40.0% | 40.0% | 45.0% | 52.0% |

APPENDIX B
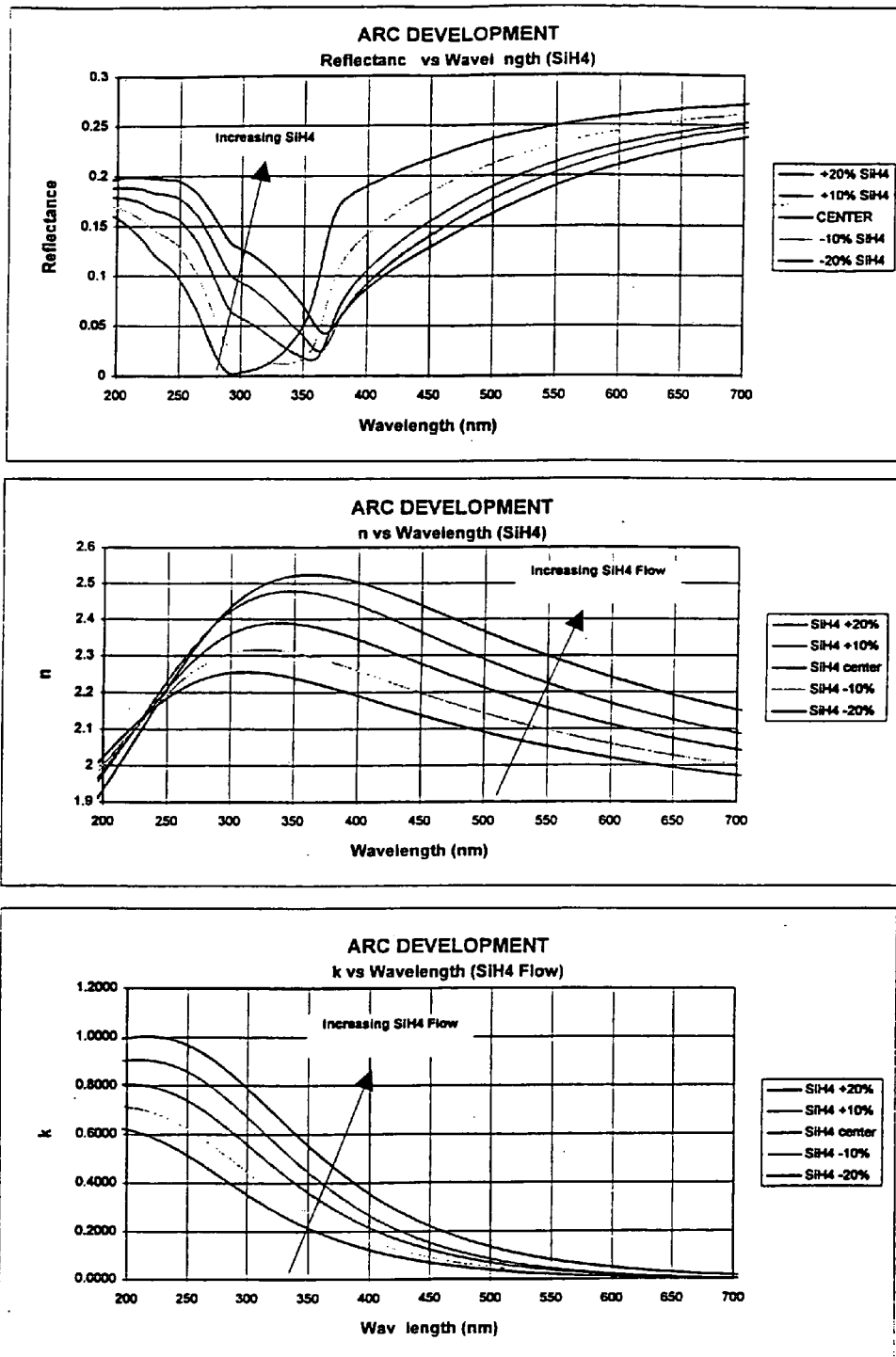

APPENDIX B
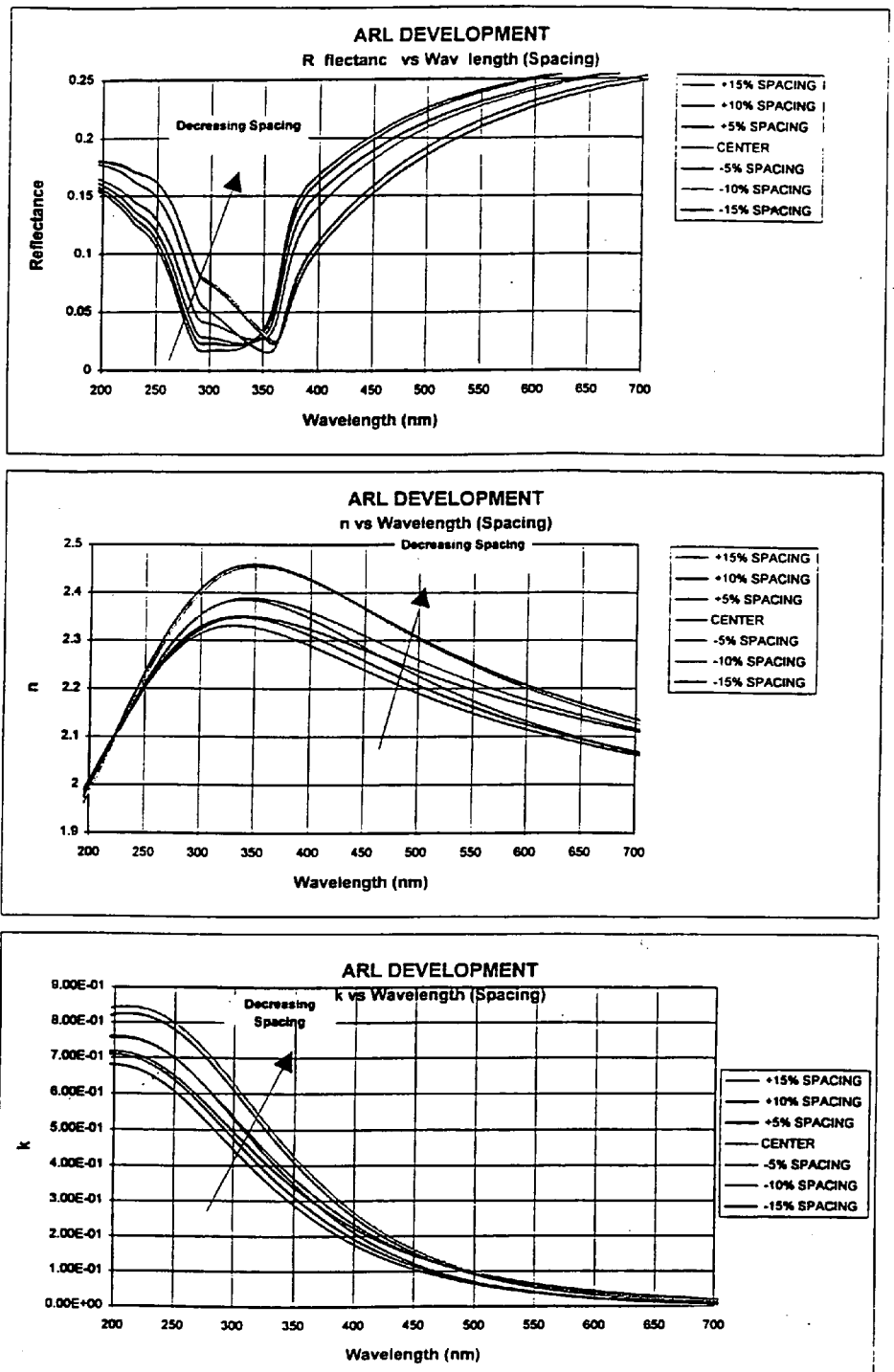

APPENDIX B
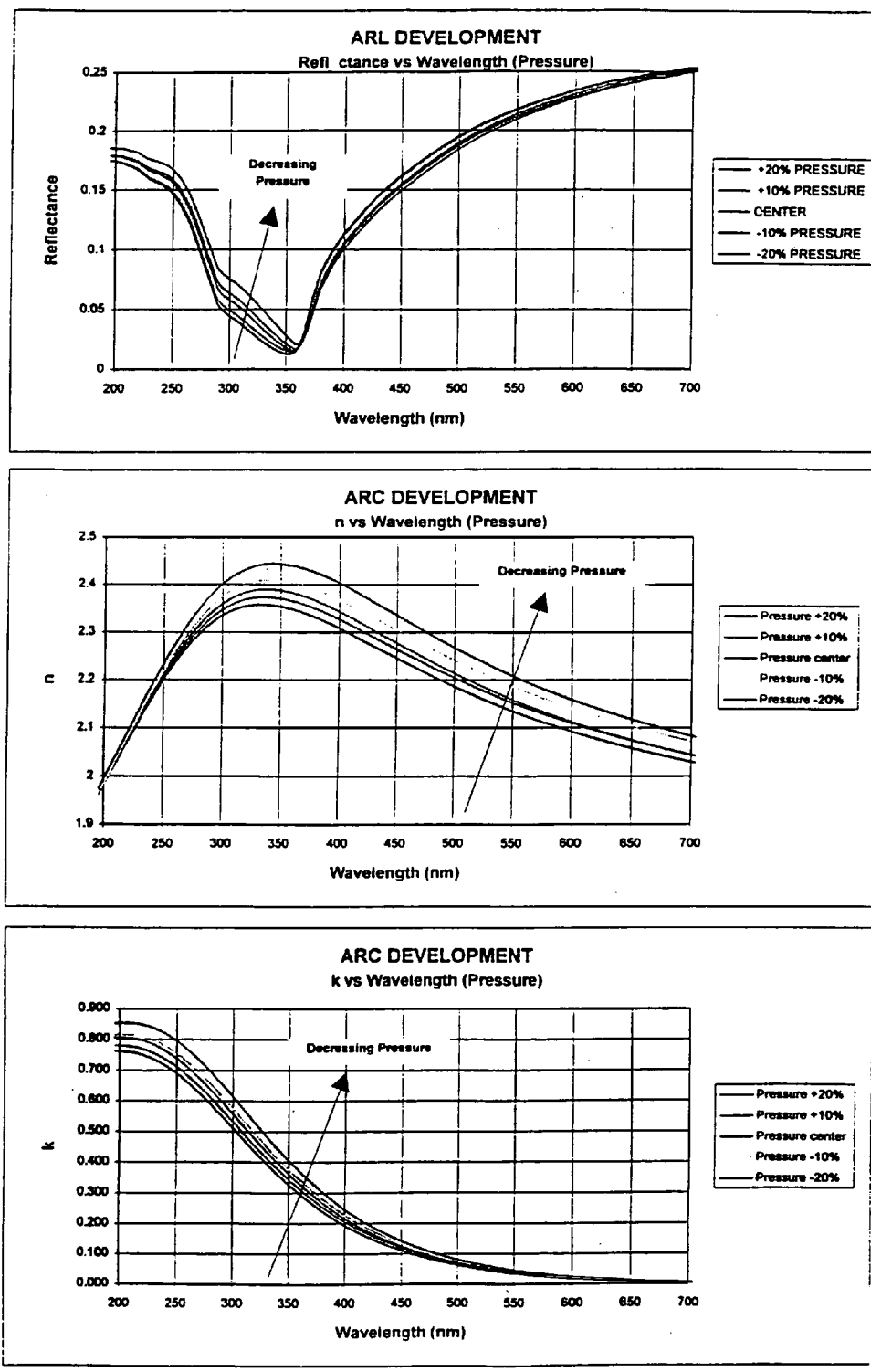

APPENDIX B
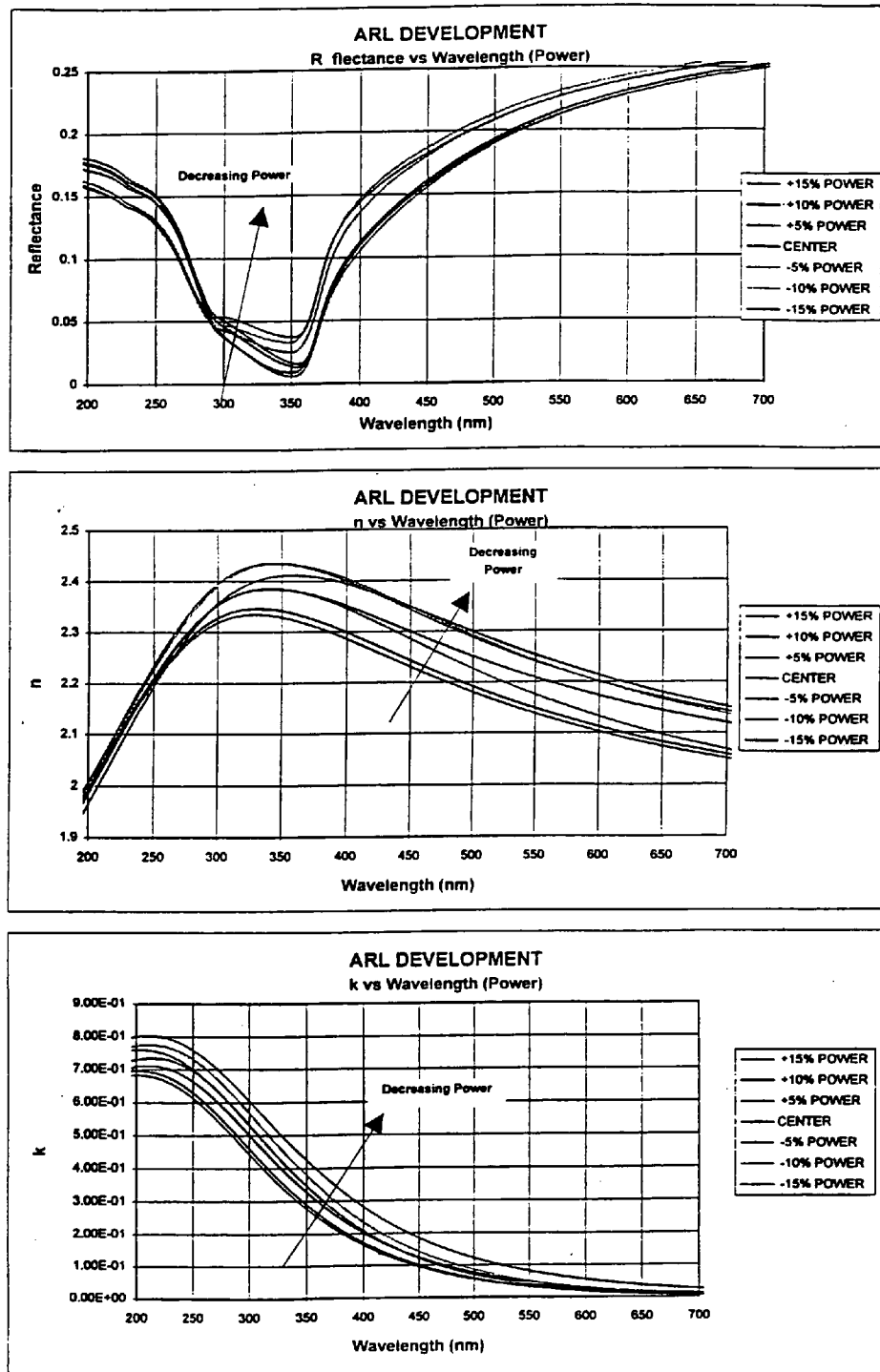

APPENDIX B
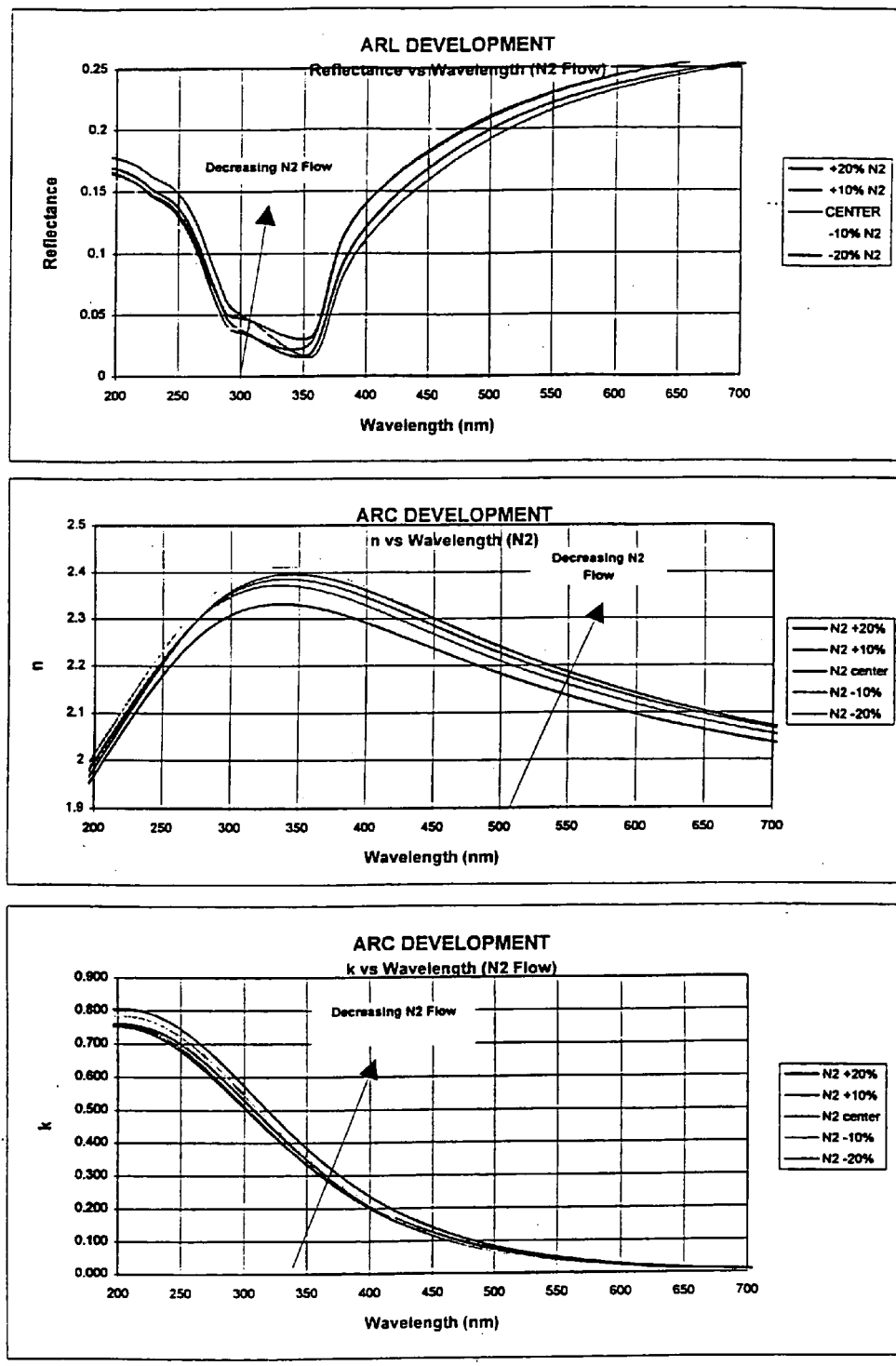

APPENDIX B
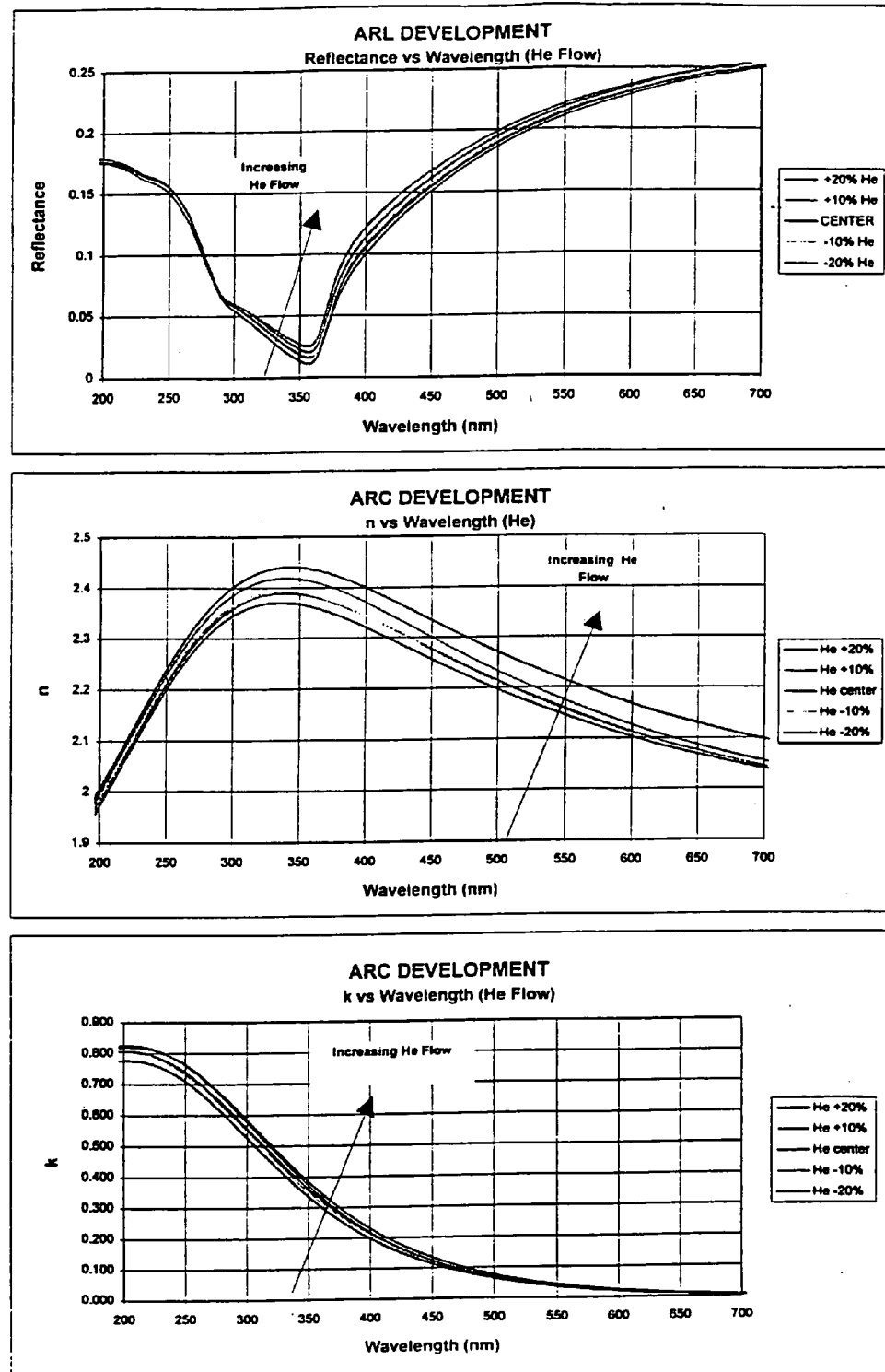

APPENDIX B
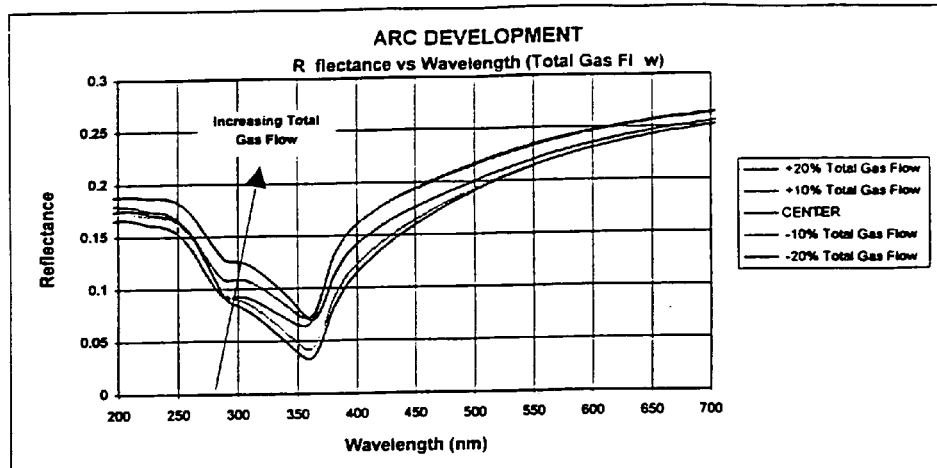
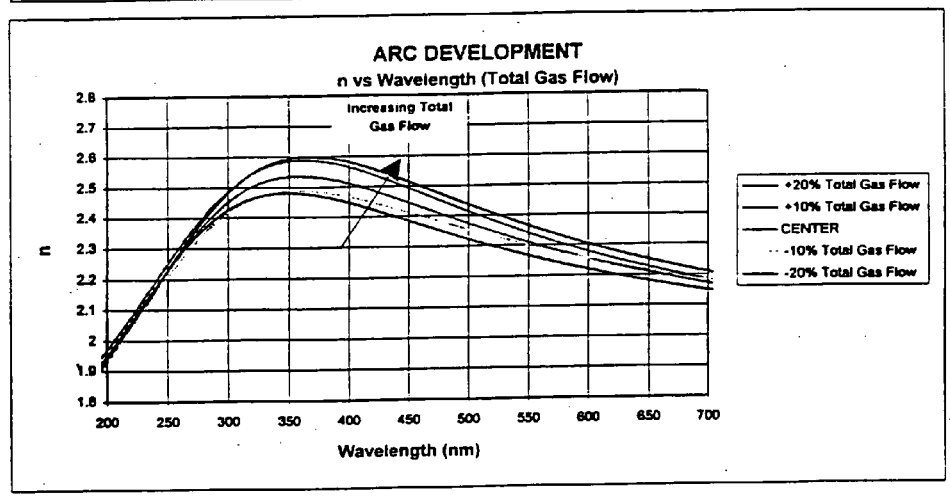
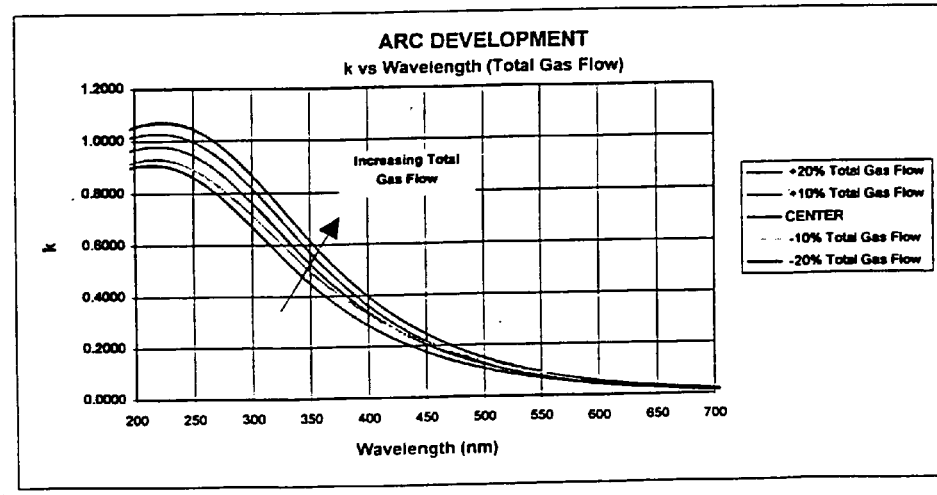

APPENDIX B
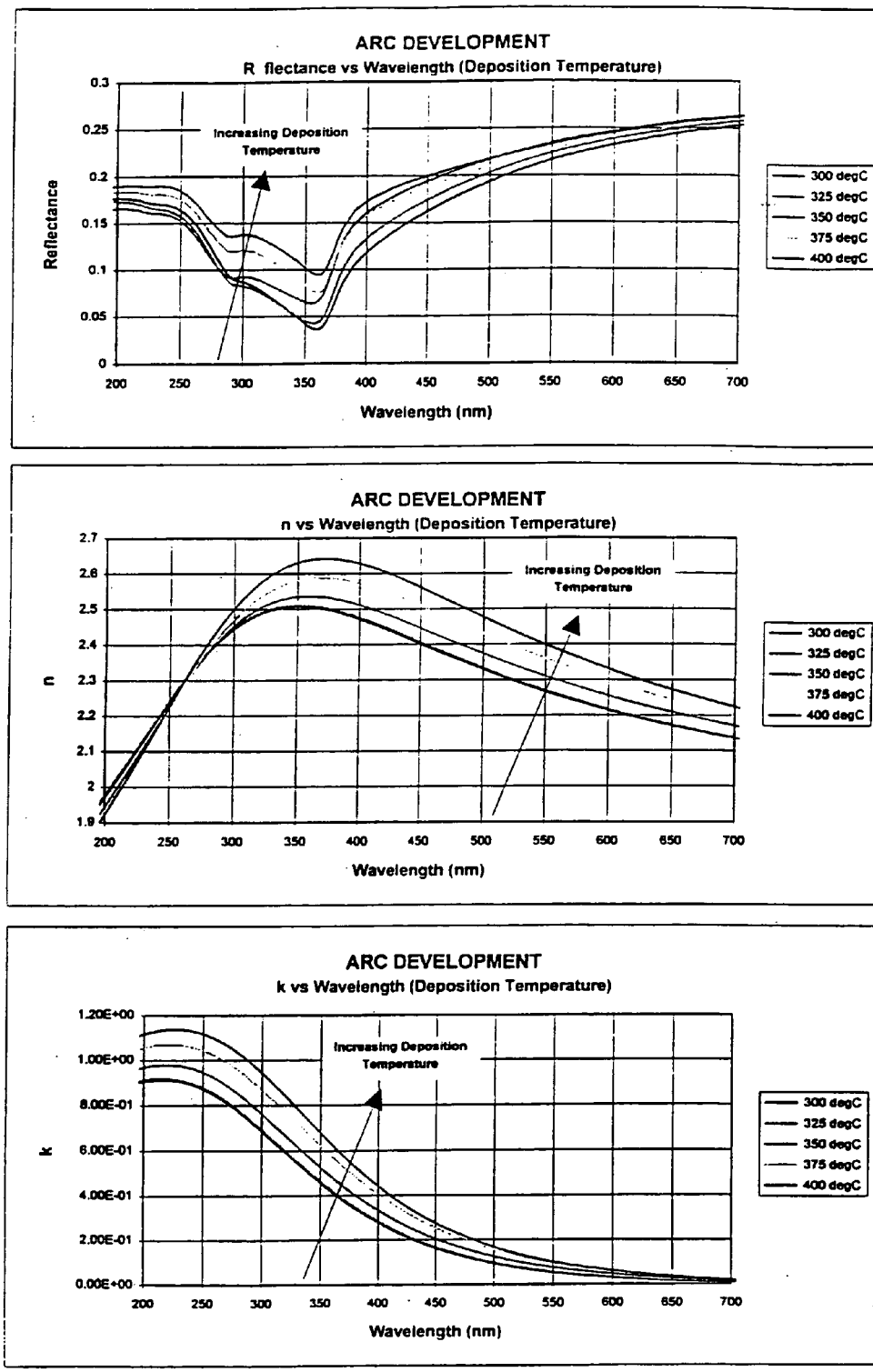

APPENDIX C
200mm ARL Process Trends (300Å/356nm)
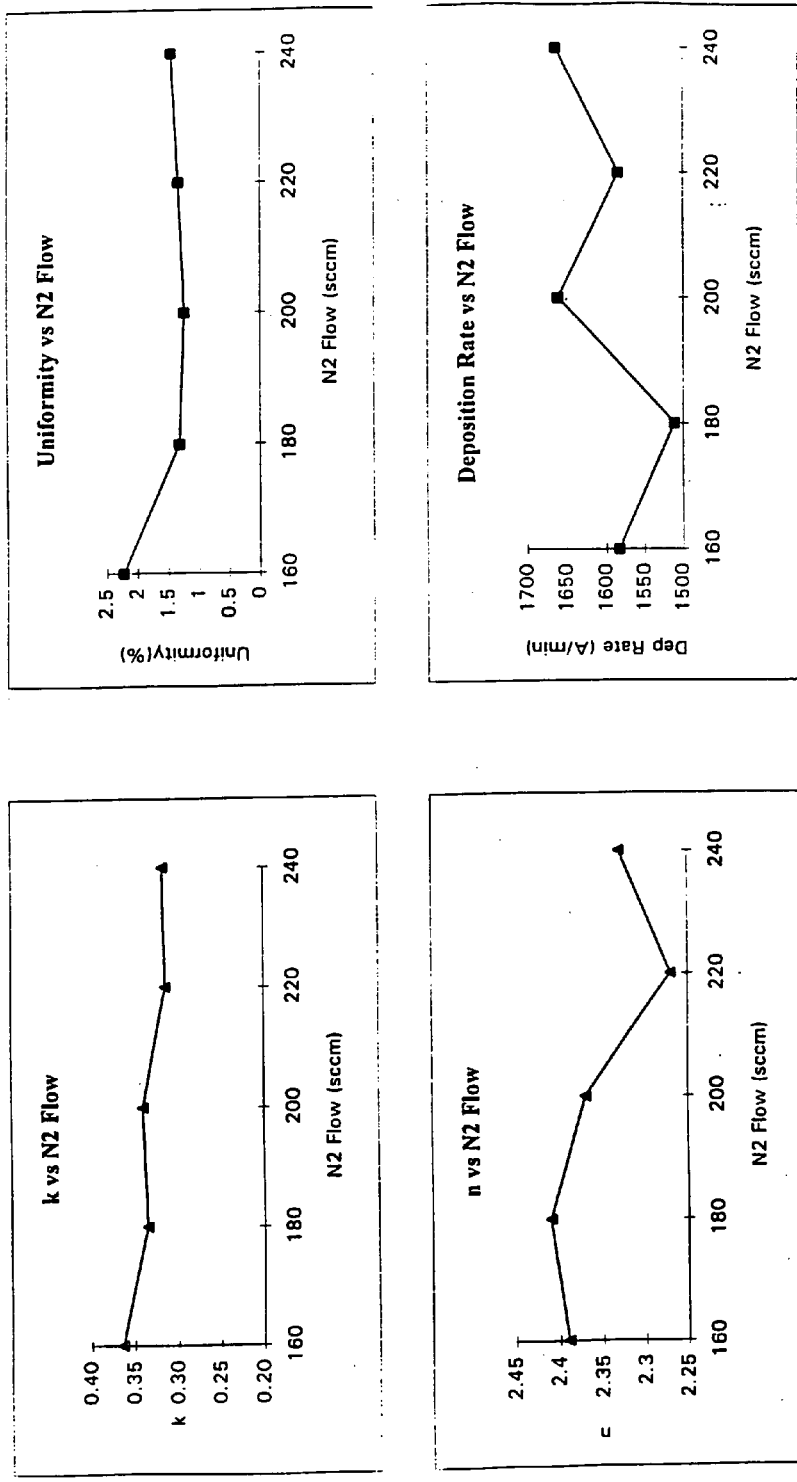

APPENDIX C
200mm ARL Process Trends (300A/356nm)
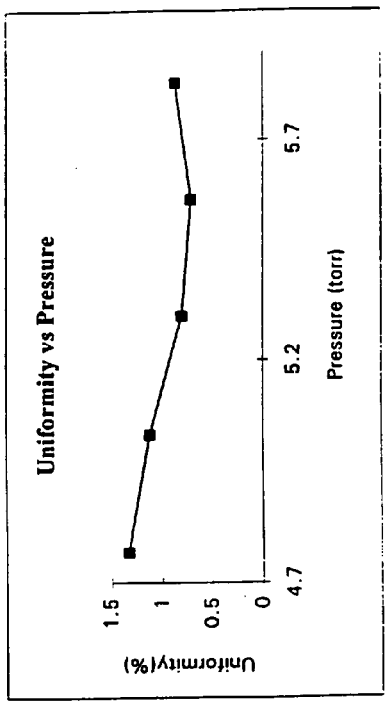
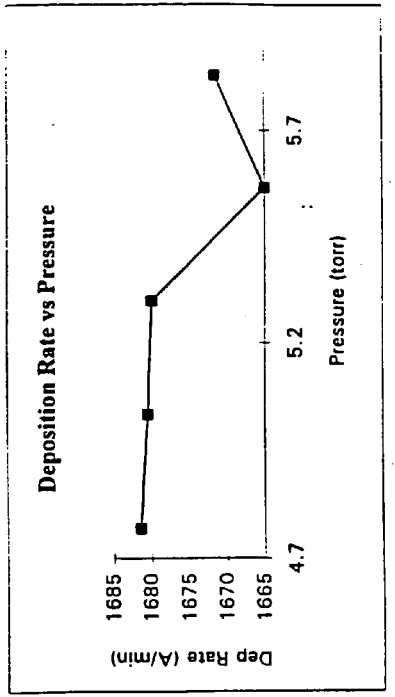
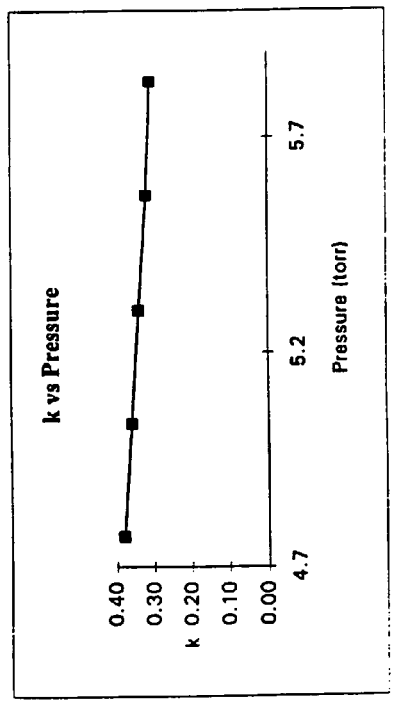
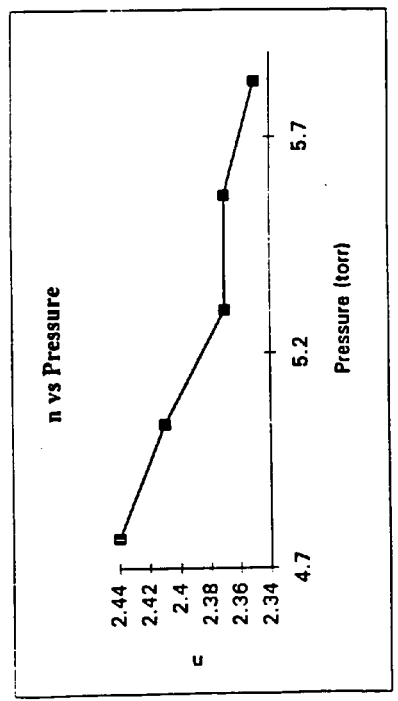

APPENDIX C
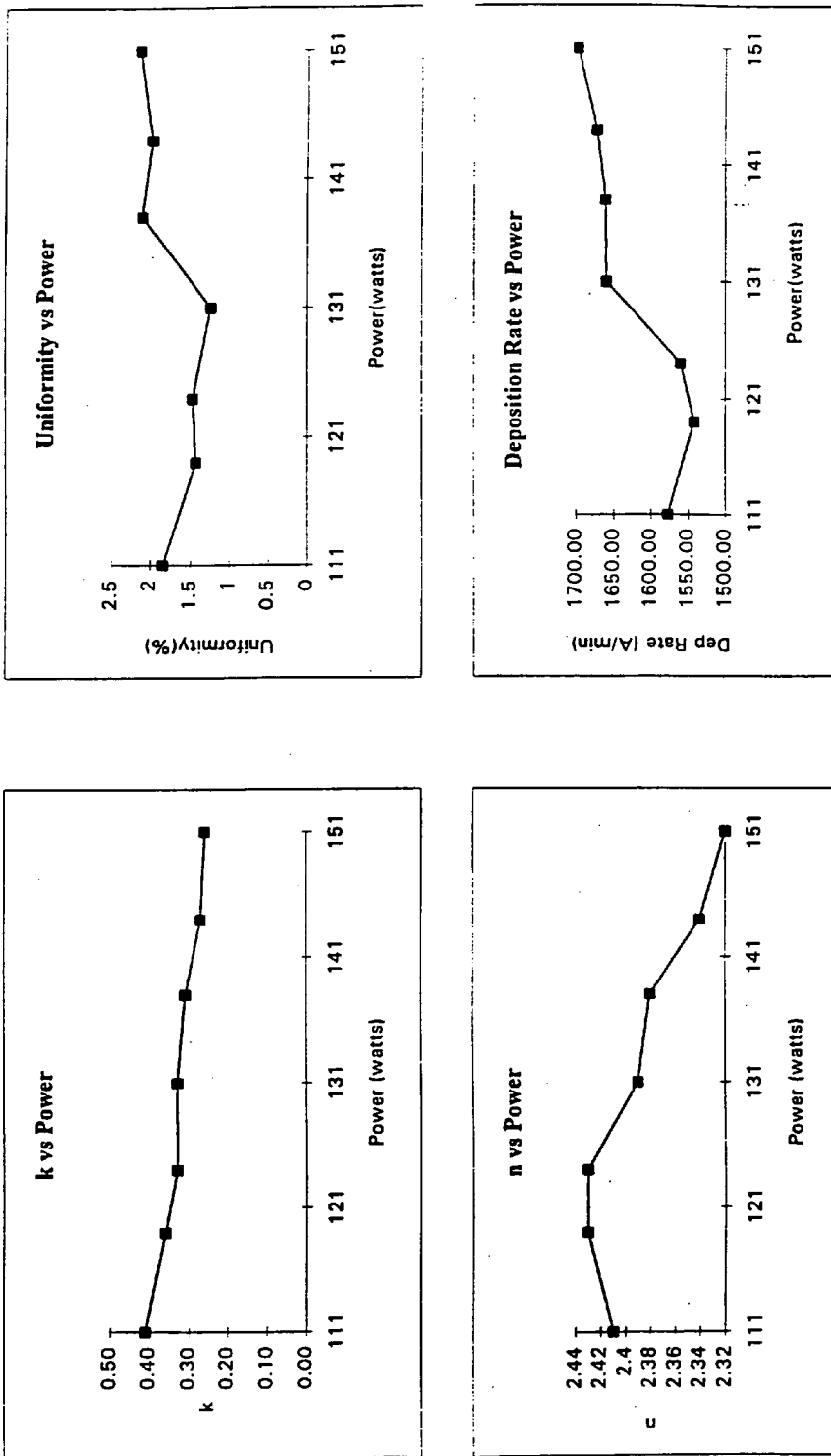

APPENDIX C
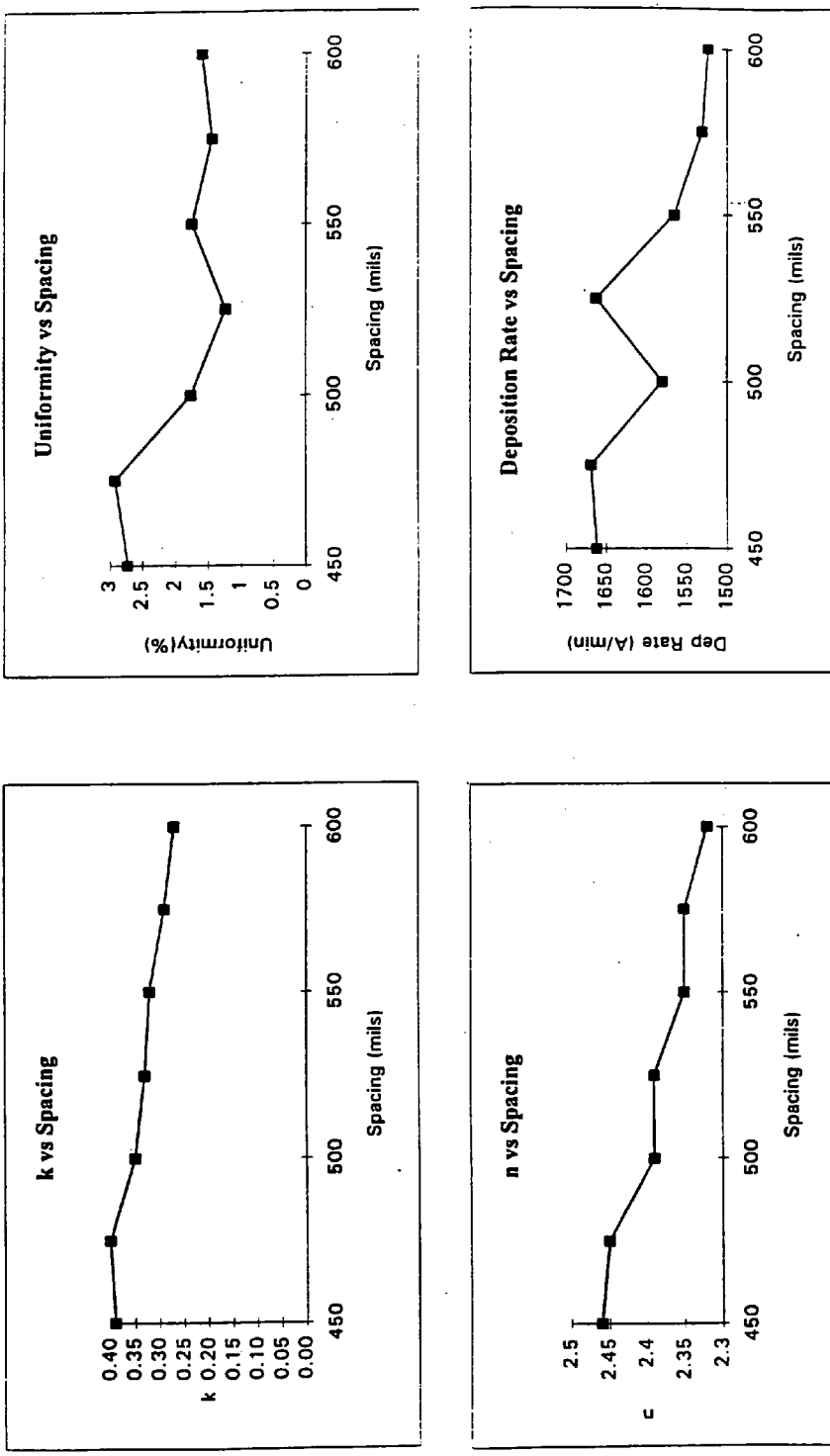

APPENDIX C
200mm ARL Process Trends (300Å/356nm)
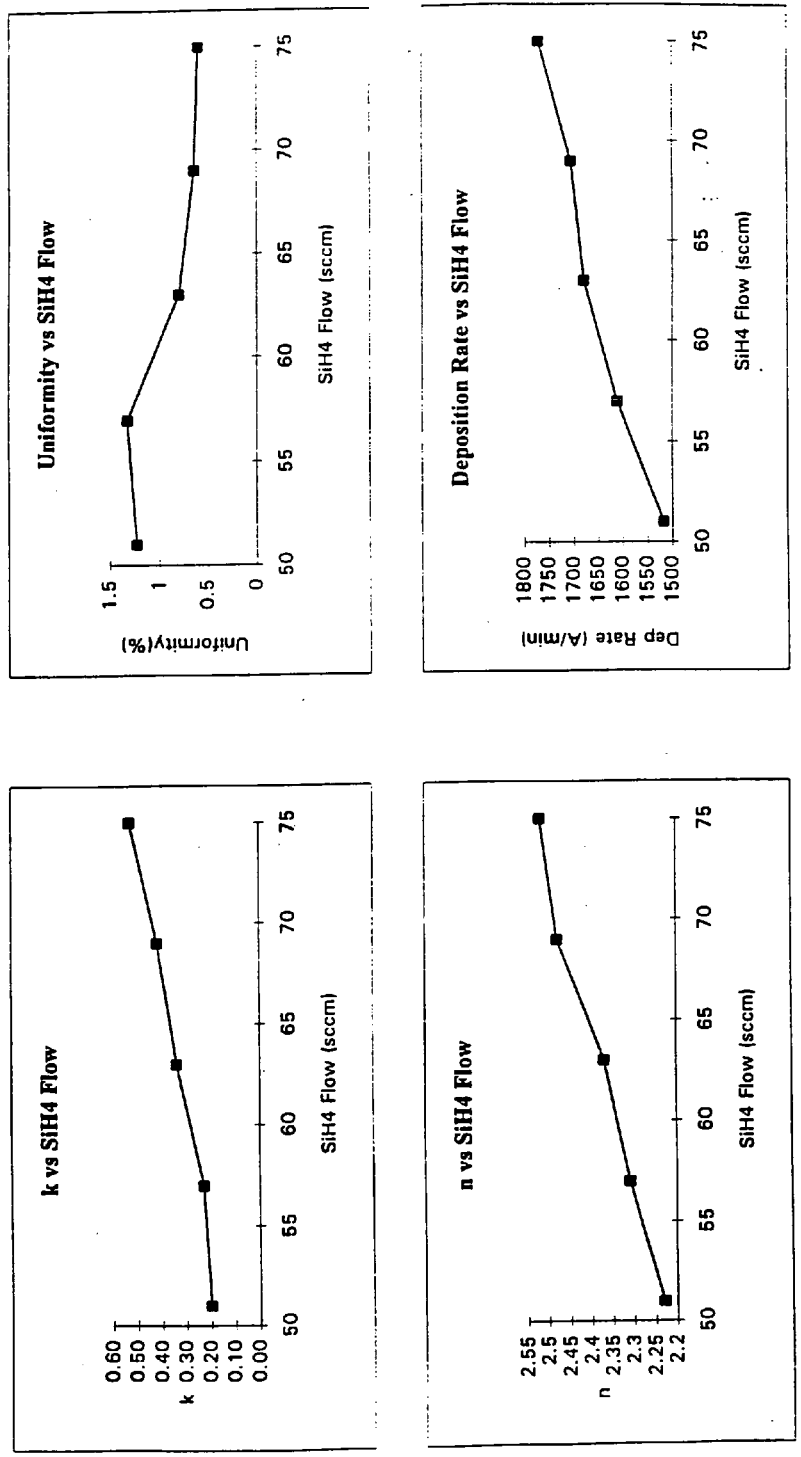

APPENDIX C
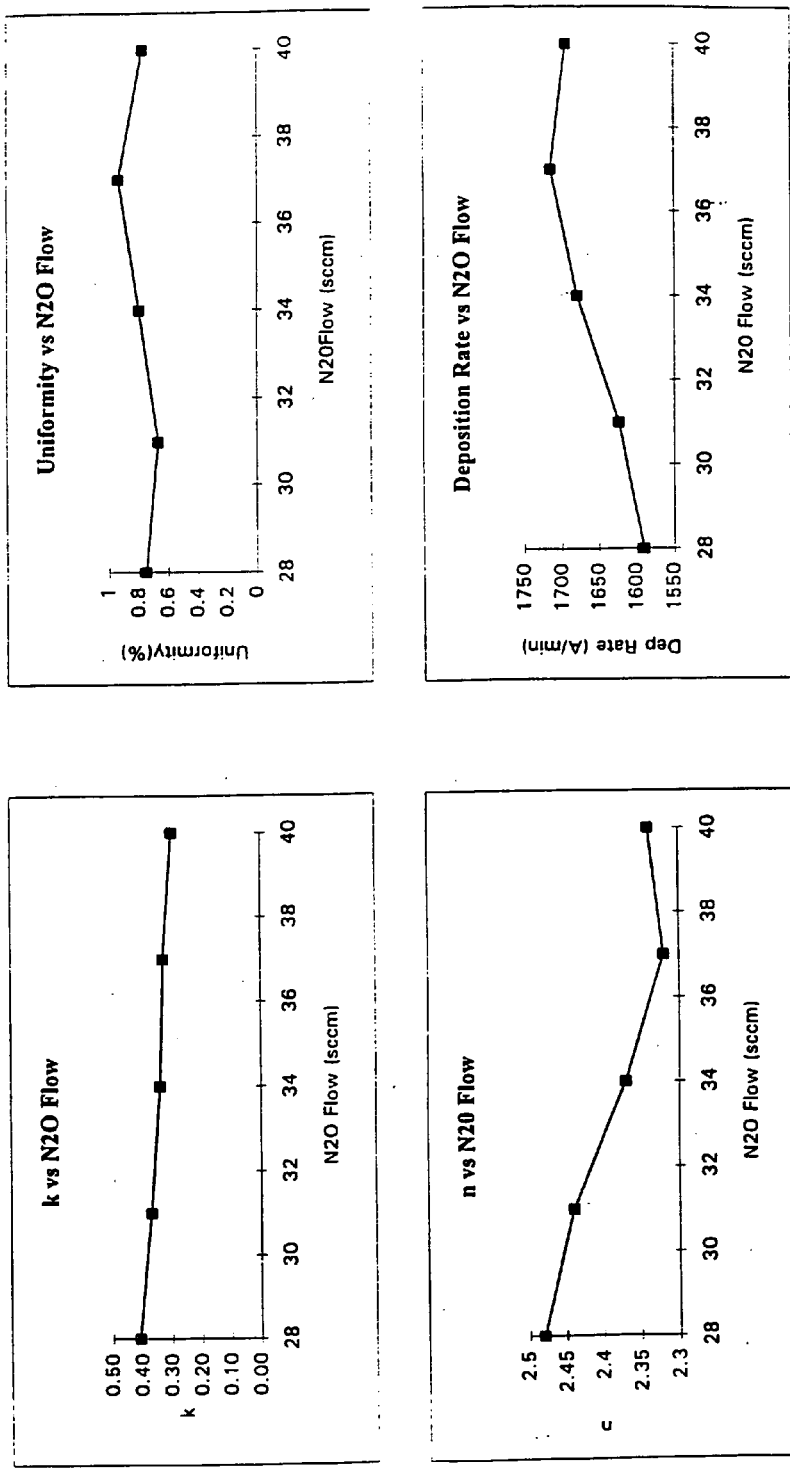

APPENDIX C
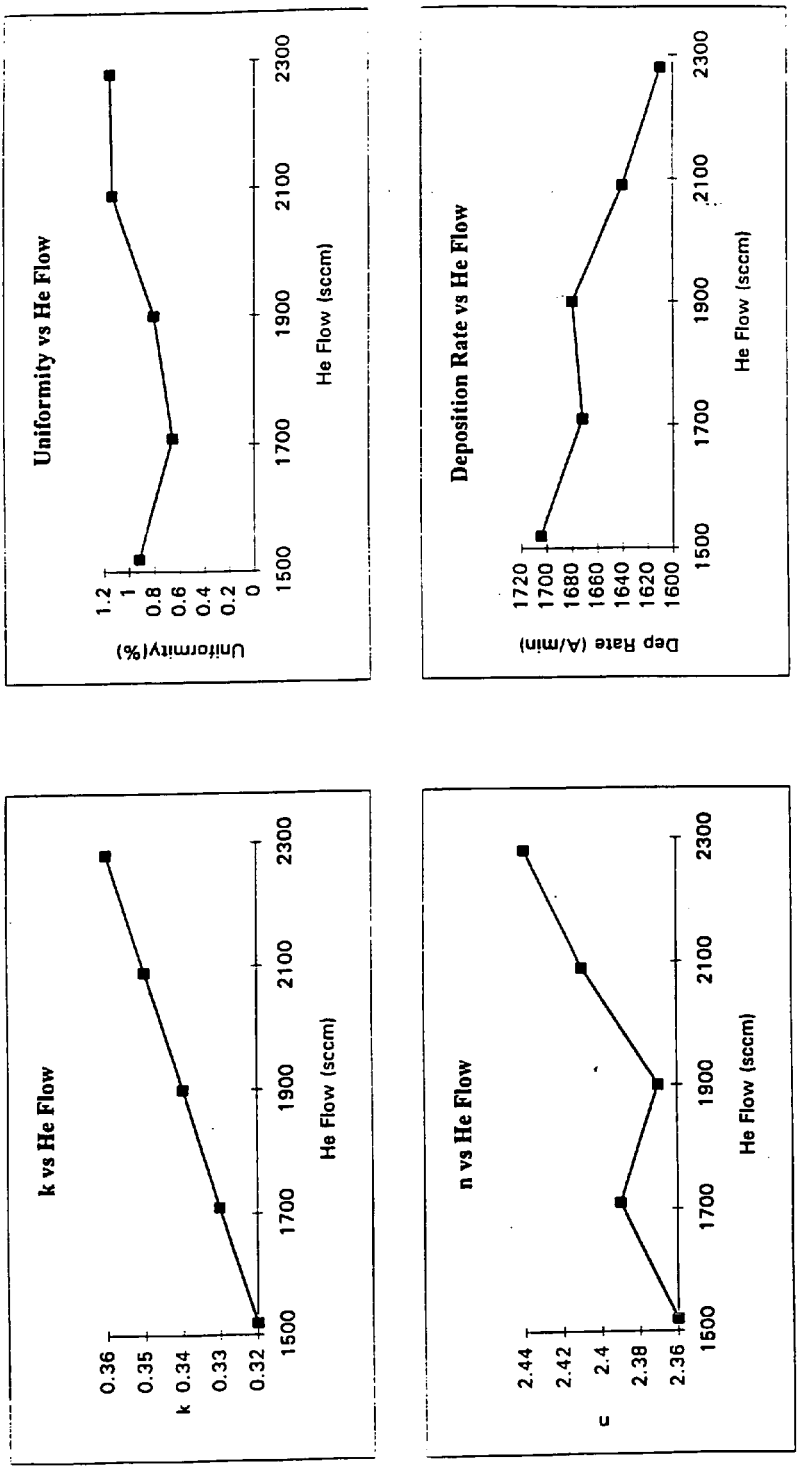

APPENDIX C
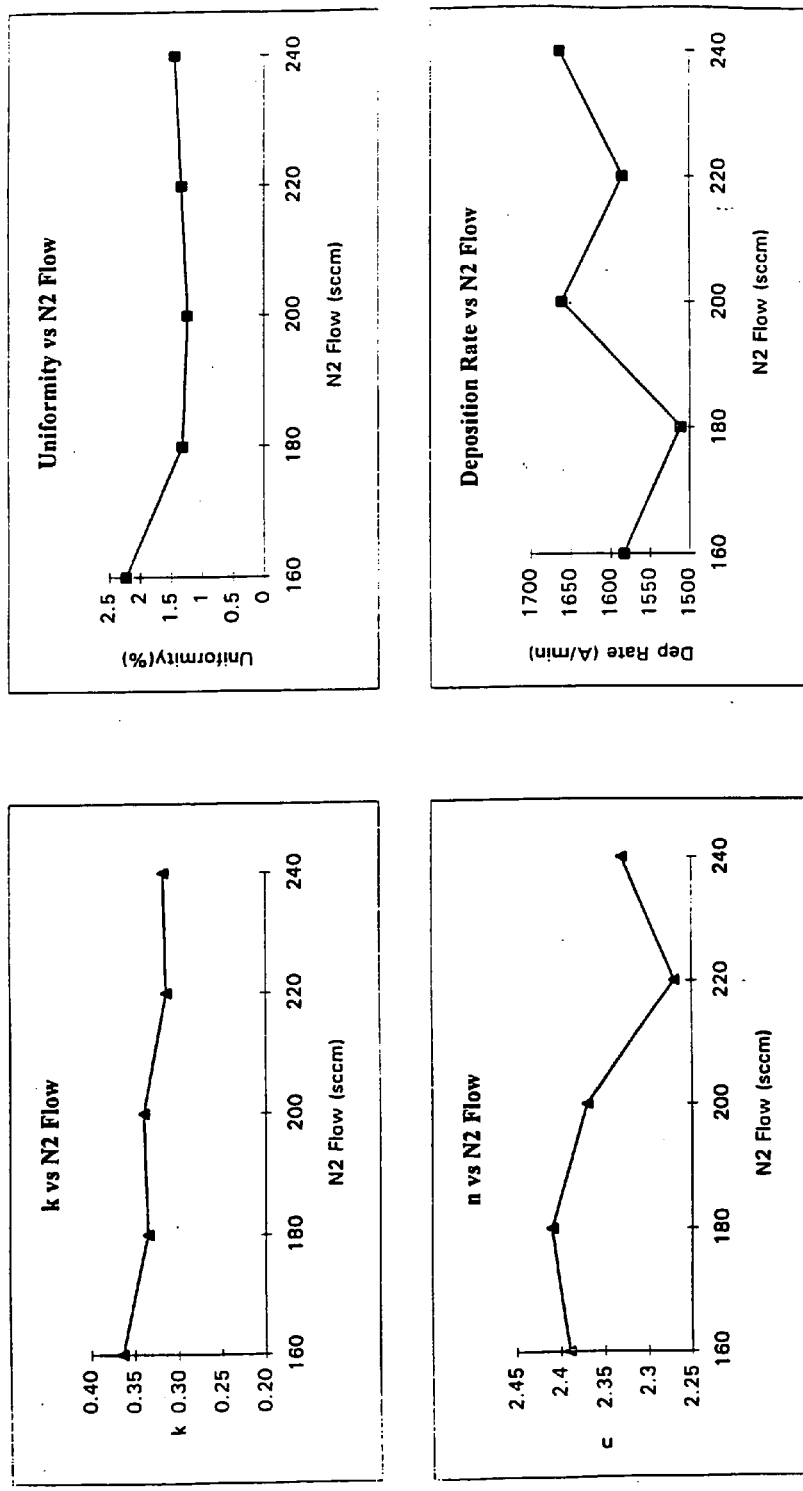
200mm ARL Process Trends (300Å/356nm)

What is claimed is:

1. A substrate processing system, comprising:
a vacuum chamber;
a substrate supporter, located within the vacuum chamber, for holding a substrate;
a gas manifold for introducing process gases into the chamber;
a gas distribution system, coupled to the gas manifold, for distributing the process gases to the gas manifold from gas sources;
a power supply coupled to the gas manifold;
a vacuum system for controlling pressure within the vacuum chamber;
a controller, including a computer, for controlling the gas distribution system, the power supply and the vacuum system, and
a memory coupled to the controller comprising a computer readable medium having a computer readable program code embodied therein for directing operation of the substrate processing system, the computer readable program code including:
computer readable program code for causing the gas distribution system to introduce a first process gas comprising a mixture of $SiH_4$ and $N_2O$ into the chamber to deposit a first plasma enhanced CVD layer over the wafer;
computer readable program code for causing the gas distribution system to introduce a second process gas comprising He into the chamber to control the deposition rate of the first layer; and
computer readable program code for controlling the gas distribution system to operate for a specified time period and for causing the first plasma enhanced CVD layer to be formed to a thickness which is an odd multiple, greater than one, of a wavelength of light to be used in a subsequent process operation on the layer.

2. A substrate processing system as in claim 1 wherein the computer readable program code for causing the gas distribution system to introduce the first process gas comprising a mixture of $SiH_4$ and $N_2O$ into the chamber controls the introduction of the $SiH_4$ to be between 5 to 300 sccm, and the rate of $N_2O$ to be between 5 to 300 sccm.

3. A substrate processing system as in claim 2 wherein the computer readable program code for causing the gas distribution system to introduce a second process gas comprising He into the chamber controls the chamber pressure at about 1 to 6 torr, the chamber pressure being the pressure inside the chamber.

4. A substrate processing system as in claim 3 wherein the computer readable program code for causing the gas distribution system to introduce the first process gas comprising a mixture of $SiH_4$ and $N_2O$ into the chamber controls the introduction of the $SiH_4$ to be at a volumetric flow rate of between 0.5 to 3 times the volumetric flow rate of $N_2O$.

5. A substrate processing system as in claim 1 further comprising:
computer readable program code for causing the gas distribution system to introduce a third process gas comprising $NH_3$ into the chamber; and
computer readable program code for causing the gas distribution system to introduce a fourth process gas comprising $N_2$ into the chamber.

6. A substrate processing system as in claim 5 wherein:
the computer readable program code for causing the gas distribution system to introduce a third process gas comprising $NH_3$ into the chamber controls the introduction of the $NH_3$ to be between a rate of 0 to 300 sccm; and
the computer readable program code for causing the gas distribution system to introduce a fourth process gas comprising $N_2$ into the chamber controls the introduction of the $N_2$ to be between a rate of 0 to 4000 sccm.

7. A substrate processing system as in claim 2 wherein the computer readable program code for causing the gas distribution system to introduce the first process gas comprising a mixture of $SiH_4$ and $N_2O$ into the chamber controls the introduction of the $SiH_4$ to be between 15 to 160 sccm, and the rate of $N_2O$ to be between a rate of 15 to 160 sccm.

8. A substrate processing system as in claim 7 further comprising:
computer readable program code for causing the gas distribution system to introduce a third process gas comprising $NH_3$ into the chamber at a rate of less than 150 sccm; and
computer readable program code for causing the gas distribution system to introduce a fourth process gas comprising $N_2$ into the chamber at a rate of less than 300 sccm.

9. A substrate processing system, comprising:
a process chamber;
a substrate support, located within the process chamber, for supporting a substrate;
a power supply;
a gas delivery system for delivering process gases into the process chamber;
a controller configured to control the power supply and the gas delivery system; and
a memory coupled to the controller comprising a computer readable medium having a computer readable program embodied therein for directing operation of the substrate processing system, the computer readable program including a first set of computer instructions for controlling the gas delivery system to introduce selected deposition gases into the process chamber at deposited gas flow rates, a second set of computer instructions for controlling the gas delivery system to add a flow of an inert gas to the selected deposition gases at a flow rate previously determined to achieve a desired low deposition rate from a plasma enhanced reaction of the selected deposition gases, the desired low deposition rate being lower than a deposition rate using the selected deposition gases at the deposition gas flow rates with a lower flow rate of the inert gas, a third set of computer instructions for controlling the power supply to supply power to the process chamber to produce a plasma enhanced reaction of the deposition gases in the process chamber to deposit a film at the low deposition rate, and a fourth set of computer instructions for controlling the gas delivery system to operate for a specified time period and for causing the film to be formed to a thickness which is an odd multiple, greater than one, of a wavelength of light to be used in a subsequent process operation on the film.

10. The substrate processing system of claim 9 wherein the inert gas comprises helium.

11. The substrate processing system of claim 9 wherein the selected deposition gases comprise silane and an oxygen source.

12. The substrate processing system of claim 9 wherein the selected deposition gases comprise silane and nitrous oxide.

13. The substrate processing system of claim 9 wherein the selected deposition gases comprise silane and a nitrogen source.

14. The substrate processing system of claim 9 further comprising a vacuum system for controlling pressure within the process chamber, and wherein the computer-readable program further comprises a fifth set of computer instructions for controlling the vacuum system to maintain a chamber pressure in the range of 1–6 Torr, and wherein the selected deposition gases comprise $SiH_4$ flowed into the chamber at a rate of 5–300 sccm and $N_2O$ flowed into the chamber at a rate of 5–300 sccm.

15. The substrate processing system of claim 14 further comprising a heater for heating the substrate, and wherein the computer-readable program further comprises a fifth set of computer instructions for controlling the heater to heat the substrate to a temperature in the range of 200–400° C.

16. The substrate processing system of claim 15 wherein the substrate support is spaced from the gas distribution system at a distance in the range of 200–600 mils.

17. The substrate processing system of claim 14 wherein the selected deposition gases further comprise $NH_3$ flowed into the chamber at a rate of less than 300 sccm, and $N_2$ flowed into the chamber at a rate of less than 4000 sccm.

18. A substrate processing system, comprising:
a process chamber;
a substrate support, located within the process chamber, for supporting a substrate;
an RF power supply;
a heater;
a gas delivery system for delivering process gases into the process chamber;
a controller configured to control the power supply and the gas delivery system; and
a memory coupled to the controller comprising a computer readable medium having a computer readable program embodied therein for directing operation of the substrate processing system, the computer readable program including a first set of computer instructions for controlling the gas delivery system to flow He into the process chamber at a selected flow rate to provide a chamber pressure in the range of 1–6 Torr, a second set of computer instructions for controlling the RF power supply to supply power of 50–500 Watts to the process chamber, a third set of computer instructions for controlling the heater to heat the substrate to a temperature in the range of 200–400° C., a fourth set of computer instructions for controlling the gas delivery system to flow $SiH_4$ at a flow rate of 5–300 sccm into the process chamber, a fifth set of computer instructions to flow $N_2O$ at a flow rate of 5–300 sccm into the process chamber, wherein a ratio of the selected flow rate of He to the combined flow rate of $SiH_4$ and $N_2O$ is at least 6.25:1 to deposit an antireflective layer on the substrate at a deposition rate which is lower than a deposition rate using the same flow rate of $SiH_4$ and the same flow rate of $N_2O$ with a lower flow rate of He, and a sixth set of computer instructions for controlling the gas delivery system to operate for a specified time period and for causing the antireflective layer to be formed to a thickness which is an odd multiple, greater than one, of a wavelength of light to be used in a subsequent process operation on the layer.

19. A substrate processing system, comprising:
a process chamber;
a substrate support, located within the process chamber, for supporting a substrate;
a power supply;
a gas delivery system for delivering process gases into the process chamber;
a controller configured to control the power supply and the gas delivery system; and
a memory coupled to the controller comprising a computer readable medium having a computer readable program embodied therein for directing operation of the substrate processing system, the computer readable program including a first set of computer instructions for controlling the gas delivery system to flow selected deposition gases into the process chamber at deposition gas flow rates, a second set of computer instructions for controlling the gas delivery system to add a flow of an inert gas to the selected deposition gases at a flow rate previously determined to achieve a desired low deposition rate from a reaction of the selected deposition gases, the desired low deposition rate being lower than a deposition rate using the selected deposition gases at the deposition gas flow rates with a lower flow rate of the inert gas, a third set of computer instructions for controlling the power supply to supply power to the process chamber to react the deposition gases to deposit a film at the low deposition rate, and a fourth set of computer instructions for controlling the gas delivery system to operate for a specified time period and for causing the film to be formed to a thickness which is an odd multiple, greater than one, of a wavelength of light to be used in a subsequent process operation on the film.

20. A substrate processing system comprising:
a process chamber;
a substrate support, located within the process chamber, for supporting a substrate;
a gas delivery system for delivering selected deposition gases into the process chamber at deposition gas flow rates;
means for adding a flow of an inert gas to the selected deposition gases at a flow rate previously determined to achieve a desired low deposition rate from plasma enhanced reaction of the selected deposition gases, the desired low deposition rate being lower than a deposition rate using the selected deposition gases at the deposition gas flow rates with a lower flow rate of the inert gas; and
means for depositing a thin film at the low deposition rate from a plasma enhanced reaction of the deposition gases and for causing the thin film to be formed to a thickness which is an odd multiple, greater than one, of a wavelength of light to be used in a subsequent process operation on the thin film.

21. The system of claim 20 further comprising:
means for maintaining a chamber pressure of the process chamber in the range of 1–6 Torr; and
means for heating the substrate to a temperature in the range of 200–400° C.

22. A substrate processing system comprising:
a processing chamber;
a substrate support, located within the processing chamber, for supporting a substrate;
means for flowing He into the processing chamber at a selected flow rate to provide a chamber pressure in the range of 1–6 Torr;
means for connecting the chamber to an RF power supply to receive 50–500 Watts;
means for heating the substrate to a temperature in the range of 200–400° C.;

means for flowing SiH$_4$ through a gas distribution system at a flow rate of 5–300 sccm; and means for flowing N$_2$O through the gas distribution system at a flow rate of 5–300 sccm, wherein a ratio of the selected flow rate of He to the combined flow rate of SiH$_4$ and N$_2$O is at least 6.25:1 to deposit an antireflective layer on the substrate at a deposition rate which is lower than a deposition rate using the same flow rate of SiH$_4$ and the same flow rate of N$_2$O with a lower flow rate of He and to a thickness which is an odd multiple, greater than one, of a wavelength of light to be used in a subsequent process operation on the antireflective layer.

23. The system of claim 22 further comprising means for introducing NH$_3$ into the chamber at a rate of 0–300 sccm.

24. The system of claim 23 further comprising means for introducing N$_2$ into the chamber at a rate of 0–4000 sccm.

25. A substrate processing system comprising:

a substrate processing chamber;

a substrate support, located within the process chamber, for supporting a substrate;

a gas delivery system for delivering process gases into the substrate processing chamber;

means for forming an antireflective layer over a layer on the substrate by flowing selected deposition gases into the substrate processing chamber at deposition gas flow rates and adding a flow of an inert gas to the selected deposition gases to deposit the antireflective layer at a desired deposition rate which is lower than a deposition rate using the selected deposition gases at the deposition gas flow rates with a lower flow rate of the inert gas;

means for forming a layer of photoresist on the antireflective layer, the antireflective layer having a thickness and refractive indices such that a first reflection from an interface between the photoresist and the antireflective layer of an exposure light will be an odd number which is at least 3 multiplied by 180° out of phase with a second reflection from an interface between the antireflective layer and the substrate layer of the exposure light; and means for forming a photoresist pattern by exposing the photoresist layer to the exposure light and developing the exposed photoresist layer.

26. A substrate processing system comprising:

a substrate processing chamber;

a substrate support, located within the process chamber, for supporting a substrate;

a gas delivery system for delivering process gases into the substrate processing chamber;

means for forming an SiON antireflective layer over a first layer on the substrate by flowing selected deposition gases into the substrate processing chamber at deposition gas flow rates and adding a flow of an inert gas to the selected deposition gases to deposit the SiON antireflective layer at a desired deposition rate which is lower than a deposition rate using the selected deposition gases at the deposition gas flow rates with a lower flow rate of the inert gas, said antireflective layer having a refractive index in the range of 1.7–2.9, an absorptive index in the range of 0–1.3, and a thickness in the range of 200–3000 angstroms;

means for forming a layer of photoresist over the antireflective layer; and means for forming a photoresist pattern by exposing the photoresist layer to an exposure light having a wavelength of 365 nm or less and developing the exposed photoresist layer, wherein a phase shift of an odd multiple of at least 3 multiplied by 180° exists between a first reflection of the exposure light from an interface between the photoresist layer and the antireflective layer and a second reflection of the exposure light from an interface between the antireflective layer and the first layer, the first reflection having almost the same intensity as the second reflection to thereby substantially cancel the first and second reflections.

27. A substrate processing system comprising:

a substrate processing chamber;

a substrate support, located within the process chamber, for supporting a substrate;

a gas delivery system for delivering process gases into the substrate processing chamber;

means for flowing selected deposition gases into the substrate processing chamber at deposition gas flow rates;

means for adding a flow of an inert gas to the selected deposition gases at a flow rate previously determined to achieve a desired low deposition rate from a reaction of the selected deposition gases, said desired low deposition rate being lower than a deposition rate using said selected deposition gases at said deposition gas flow rates with a lower flow rate of said inert gas; and means for depositing a thin film on the substrate at said low deposition rate from said reaction of said deposition gases to a thickness which is an odd multiple, greater than one, of a wavelength of light to be used in a subsequent process operation on the thin film.

* * * * *